United States Patent
Kwon et al.

(10) Patent No.: US 11,570,344 B2
(45) Date of Patent: Jan. 31, 2023

(54) CAMERA MODULE AND ELECTRONIC DEVICE INCLUDING THE SAME

(71) Applicant: SAMSUNG ELECTRONICS CO., LTD., Suwon-si (KR)

(72) Inventors: Kihyun Kwon, Seoul (KR); Seunghak Lee, Hwaseong-si (KR); Jihyung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 16/867,109

(22) Filed: May 5, 2020

(65) Prior Publication Data

US 2021/0099626 A1    Apr. 1, 2021

(30) Foreign Application Priority Data

Sep. 27, 2019    (KR) .......................... 10-2019-0119822

(51) Int. Cl.
*H04N 5/225*    (2006.01)
*G03B 17/02*    (2021.01)
*H05K 9/00*    (2006.01)

(52) U.S. Cl.
CPC .......... *H04N 5/2257* (2013.01); *G03B 17/02* (2013.01); *H04N 5/2252* (2013.01); *H04N 5/2253* (2013.01); *H05K 9/0064* (2013.01)

(58) Field of Classification Search
CPC .. H04N 5/2257; H04N 5/2252; H04N 5/2253; H05K 9/0064; G03B 17/02
See application file for complete search history.

(56) References Cited

U.S. PATENT DOCUMENTS

| 7,997,812 | B2 | 8/2011 | Kim |
| 8,773,867 | B2 * | 7/2014 | Kim ...................... G03B 17/02 |
| | | | 348/374 |
| 9,097,958 | B2 | 8/2015 | Kim et al. |
| 9,154,674 | B2 | 10/2015 | Lee |
| 9,736,347 | B2 | 8/2017 | Han et al. |

(Continued)

FOREIGN PATENT DOCUMENTS

| KR | 10-0897799 B1 | 5/2009 |
| KR | 10-2012-0100856 A | 9/2012 |

(Continued)

OTHER PUBLICATIONS

Dictionary.com Definition of protruding, retrieved from https://www.dictionary.com/browse/protruding on Jul. 30, 2022 (Year: 2022).*

(Continued)

*Primary Examiner* — Timothy J Henn
(74) *Attorney, Agent, or Firm* — Sughrue Mion, PLLC

(57) ABSTRACT

An electronic device includes a camera module and an external structure. The camera module includes an image sensor and a shielding structure that shields components of the camera module from electromagnetic interference (EMI). The external structure two-dimensionally surrounds the camera module, and a portion of the external structure is conductive. The shielding structure includes an accommodating portion that accommodates the image sensor, and a protruding portion that protrudes from the accommodating portion to contact the external structure.

19 Claims, 36 Drawing Sheets

(56) References Cited

U.S. PATENT DOCUMENTS

| | | | |
|---|---|---|---|
| 10,063,756 B2 | 8/2018 | Kim et al. | |
| 2004/0070541 A1* | 4/2004 | Andersson | H01Q 9/42 |
| | | | 343/702 |
| 2013/0329628 A1* | 12/2013 | Yang | H04W 72/0486 |
| | | | 370/315 |
| 2014/0111684 A1* | 4/2014 | Corbin | H04N 5/2257 |
| | | | 343/702 |
| 2017/0295306 A1* | 10/2017 | Mleczko | H05K 1/181 |
| 2018/0020131 A1* | 1/2018 | Zhao | H01R 13/04 |
| 2018/0255213 A1* | 9/2018 | Ahn | H04N 5/225 |
| 2018/0261912 A1 | 9/2018 | Mizuno et al. | |
| 2019/0033553 A1 | 1/2019 | Jeong | |
| 2019/0143907 A1* | 5/2019 | Byrne | H04N 5/22521 |
| | | | 348/148 |
| 2020/0100402 A1* | 3/2020 | Schmitt | H05K 9/0037 |

FOREIGN PATENT DOCUMENTS

| | | |
|---|---|---|
| KR | 10-1263954 B1 | 5/2013 |
| KR | 10-2015-0064572 A | 6/2015 |
| KR | 10-2017-0000313 A | 1/2017 |
| KR | 10-1717640 B1 | 3/2017 |
| KR | 10-2017-0082275 A | 7/2017 |
| KR | 10-1783773 B1 | 10/2017 |
| KR | 10-1785458 B1 | 10/2017 |
| KR | 10-1952853 B1 | 2/2019 |

OTHER PUBLICATIONS

Communication dated Dec. 4, 2020, issued by the European Patent Office in counterpart European Application No. 20184933.8.

* cited by examiner

CAMERA MODULE AND ELECTRONIC DEVICE INCLUDING THE SAME

CROSS-REFERENCE TO RELATED APPLICATION

This application claims priority from Korean Patent Application No. 10-2019-0119822, filed on Sep. 27, 2019, in the Korean Intellectual Property Office, the disclosure of which is incorporated by reference herein in its entirety.

BACKGROUND

1. Field

The present disclosure relates to a camera module and an electronic device including the same, and more particularly, to a camera module including a shielding structure and an electronic device including the camera module.

2. Description of Related Art

In an electronic device including a camera module, electromagnetic waves generated by the camera module may affect another electronic component in the electronic device and electromagnetic waves generated by another electronic component in the electronic device may affect the camera module. Therefore, in order to shield electromagnetic interference (EMI) and to improve electromagnetic compatibility (EMC), the camera module may have the shielding structure.

SUMMARY

It is an aspect to provide a camera module having high electromagnetic compatibility (EMC) and an electronic device including the same.

According to an aspect of an embodiment, there is provided an electronic device including a camera module that includes an image sensor and a shielding structure configured to shield components of the camera module from electromagnetic interference (EMI); and an external structure that two-dimensionally surrounds the camera module, at least a portion of the external structure being conductive, wherein the shielding structure comprises an accommodating portion configured to accommodate the image sensor, and a protruding portion that protrudes from the accommodating portion, and wherein the protruding portion of the shielding structure contacts the external structure.

According to an aspect of an embodiment, there is provided an electronic device including a main circuit board; an electronic component connected to the main circuit board; a first camera module connected to the main circuit board; a device housing including a side wall that surrounds a space in which the main circuit board, the electronic component, and the first camera module are positioned; and a front panel configured to cover the space in which the main circuit board, the electronic component, and the first camera module are positioned, wherein at least a portion of the device housing is conductive, wherein the first camera module comprises a first image sensor, and a first shielding structure that surrounds the first image sensor, wherein the first shielding structure of the first camera module comprises a first protruding portion that contacts the device housing.

According to an aspect of an embodiment, there is provided an electronic device including a main circuit board; a first camera module connected to the main circuit board; a second camera module connected to the main circuit board; a flange that surrounds the first camera module and the second camera module; and a device housing configured to accommodate the main circuit board, the first camera module, the second camera module, and the flange, wherein at least a portion of the flange is conductive, wherein the first camera module comprises a first image sensor and a first shielding structure, the first shielding structure surrounding the first image sensor and including a first protruding portion that contacts the flange.

According to another aspect of an embodiment, there is provided an electronic device comprising a camera module comprising an image sensor; and a conductive shielding structure including an accommodating portion that surrounds the image sensor, and a protruding portion that protrudes from the accommodating portion and that contacts a conductive flange or a conductive portion of a device housing of the electronic device.

BRIEF DESCRIPTION OF THE DRAWINGS

Various embodiments will be more clearly understood from the following detailed description taken in conjunction with the accompanying drawings, in which.

DETAILED DESCRIPTION

Figure 1A:
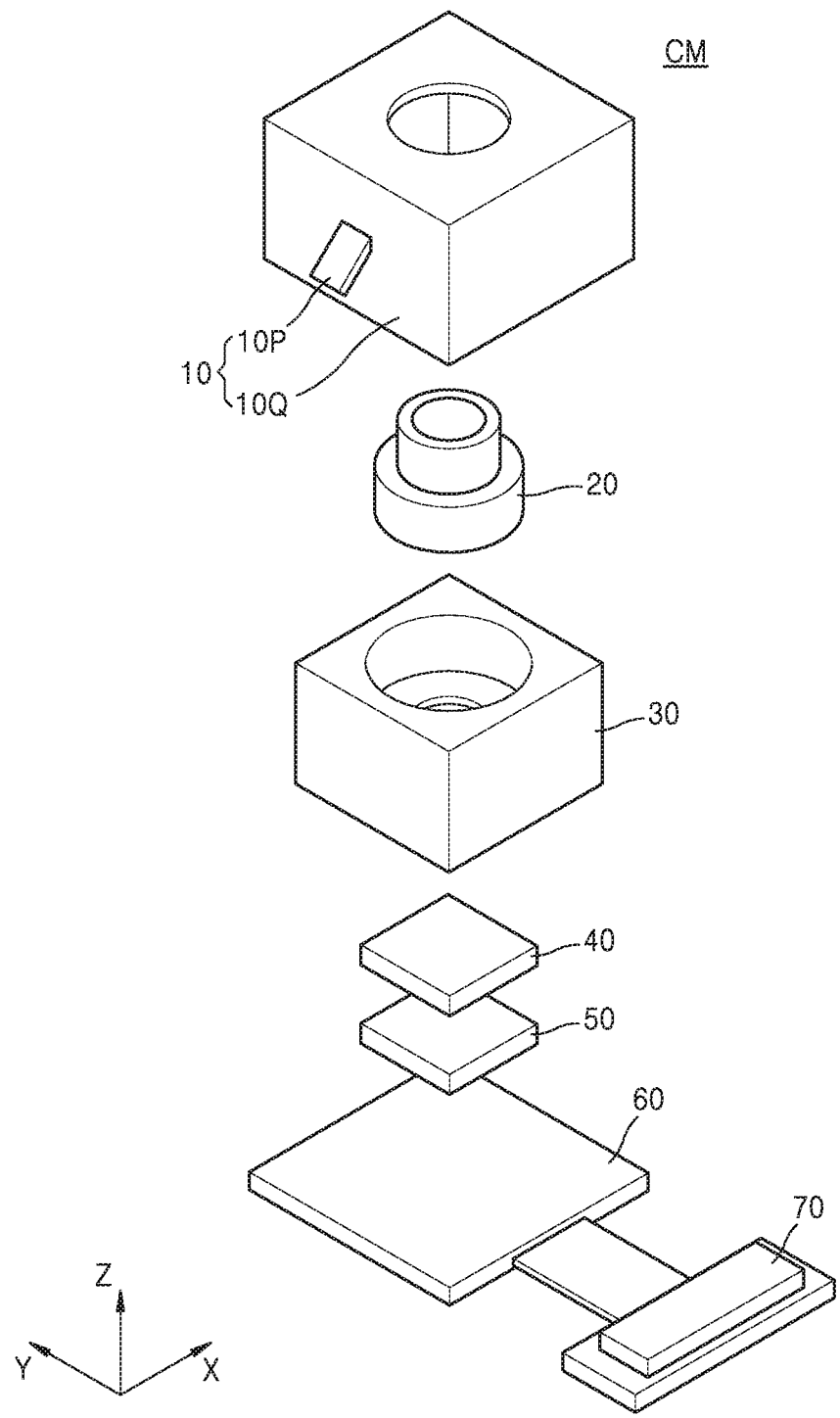
FIG. 1A is an exploded perspective view of a camera module according to an embodiment.
Figure 1B:
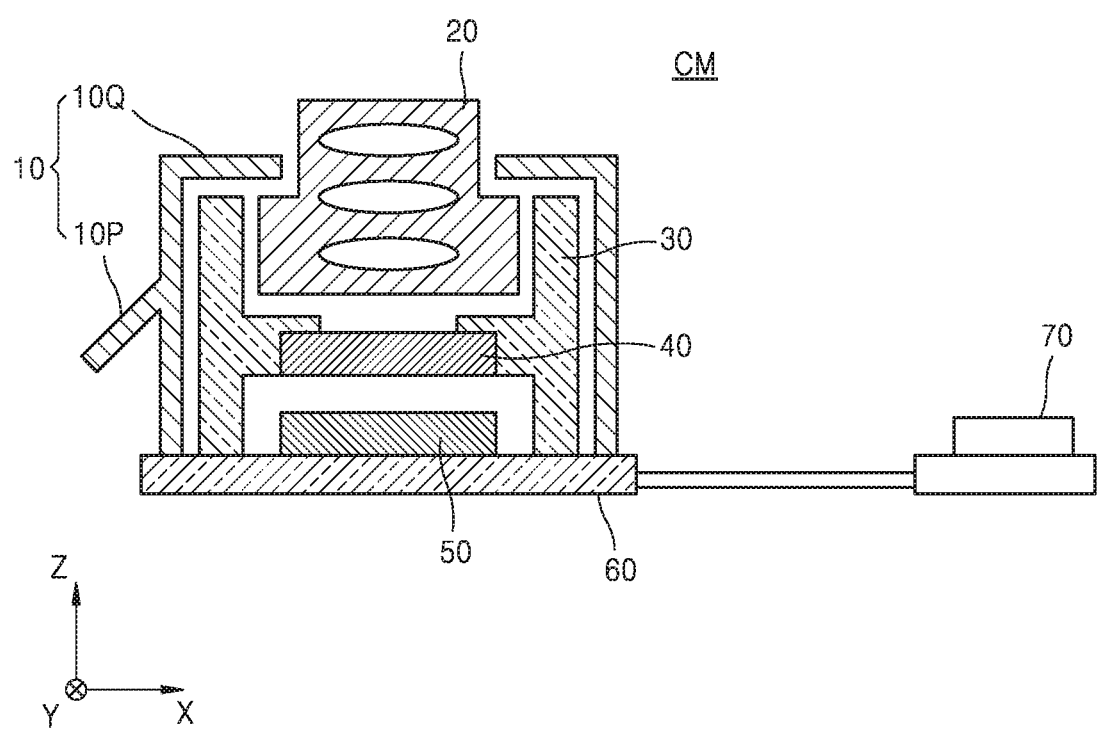
FIG. 1B is a cross-sectional view of a camera module according to an embodiment.

FIG. 1A is an exploded perspective view of a camera module CM according to an embodiment. FIG. 1B is a cross-sectional view of a camera module CM according to an embodiment.

Referring to FIGS. 1A and 1B, the camera module CM may include a module circuit board 60, a connector 70, an image sensor 50, an optical filter 40, a lens assembly 20, a module housing 30, and a shielding structure 10. The module circuit board 60 may include, for example, a printed circuit board (PCB). The connector 70 may be connected to the module circuit board 60. The camera module CM may be connected to components that are outside of the camera module CM, for example, to a main circuit board 130 (refer to FIG. 4) through the connector 70.

The image sensor 50 may be positioned on and connected to the module circuit board 60. The image sensor 50 may convert light into an electrical signal. The electrical signal generated by the image sensor 50 may be output to components outside of the camera module CM through the module circuit board 60 and the connector 70. The image sensor 50 may include, for example, a complementary metal oxide semiconductor (CMOS) sensor or a charge coupled device (CCD) sensor.

The optical filter 40 may be positioned on the image sensor 50. The optical filter 40 may block or transmit a portion of a spectrum of light that enters the optical filter 40 and that has a particular wavelength. For example, the optical filter 40 may include an infrared (IR) blocking filter that blocks near infrared (NIR) light (for example, light of wavelengths from about 700 nm to about 1,150 nm). In some embodiments, the optical filter 40 may be omitted.

The lens assembly 20 may be positioned on the optical filter 40. The lens assembly 20 may include at least one lens for focusing the light that passes therethrough. The module housing 30 may accommodate the image sensor 50, the optical filter 40, and the lens assembly 20. That is, the module housing 30 may surround the image sensor 50, the optical filter 40, and the lens assembly 20. The module housing 30 may fix the optical filter 40 and the lens assembly 20. In some embodiments, the module housing 30 may be omitted and the shielding structure 10 may function as the module housing 30. That is, in some embodiments, the shielding structure 10 may accommodate and protect the image sensor 50, the optical filter 40, and the lens assembly 20.

The shielding structure 10 may accommodate the module housing 30. The shielding structure 10 may surround the image sensor 50. In order that light may enter the lens assembly 20, the module housing 30 may include an opening or a window that exposes the lens assembly 20. The shielding structure 10 may shield components accommodated therein from electromagnetic interference (EMI). The shielding structure 10 is conductive and may include a conductive material. For example, the shielding structure 10 may include a metal such as copper (Cu), aluminum (Al), gold (Au), nickel (Ni), silver (Ag), iron (Fe), or a combination of the above metals.

The shielding structure 10 may include an accommodating portion 10Q that accommodates, that is, that surrounds the image sensor 50, and a protruding portion 10Q that protrudes outward from the accommodating portion 10Q. The accommodating portion 10Q may include side walls and a top. For example, the accommodating portion 10Q may include four side walls and a top connected to each of the four side walls. The top of the accommodating portion 10Q may include the opening or the window through which light may enter the lens assembly 20. The protruding portion 10Q of the shielding structure 10 may protrude from the side wall of the accommodating portion 10Q outward, for example, in a −X direction in FIG. 1A. The protruding portion 10P of the shielding structure 10 is conductive and may include a conductive material. The protruding portion 10P of the shielding structure 10 may include a material that is the same as the accommodating portion 10Q of the shielding structure 10. However, embodiments are not limited thereto and, in some embodiments, the protruding portion 10P of the shielding structure 10 may include a material that is different from the accommodating portion 10Q of the shielding structure 10.

In some embodiments, the protruding portion 10P of the shielding structure 10 may be integrated with the accommodating portion 10Q of the shielding structure 10. That is, there is not a real boundary between the protruding portion 10P and the accommodating portion 10Q of the shielding structure 10, and the protruding portion 10P of the shielding structure 10 may be distinguished from the accommodating portion 10Q of the shielding structure 10 by a virtual boundary. In other embodiments, the protruding portion 10P and the accommodating portion 10Q of the shielding structure 10 may be formed as separate bodies, and then connected together, for example by bonding, adhesive, etc. That is, in some embodiments, there may be a real boundary between the protruding portion 10P and the accommodating portion 10Q of the shielding structure 10.

The protruding portion 10P of the shielding structure 10 may contact an external structure (for example, a device housing 110 illustrated in FIG. 4 or a flange 170 illustrated in FIG. 14) that is positioned outside the camera module CM and of which at least a portion is conductive. Therefore, the shielding structure 10 may be electrically connected to the external structure and accordingly, electromagnetic compatibility (EMC) by the shielding structure may be improved by the shielding structure 10 illustrated in FIG. 1A. In addition, heat generated by the camera module CM may be transmitted to the external structure and accordingly, heat release performance by the shielding structure 10 may be improved. Therefore, the camera module CM according to an embodiment may have improved EMC and heat release performance.

FIGS. 2A to 2D are cross-sectional views illustrating examples of shielding structures 10a to 10d according to embodiments.

Figure 2A:
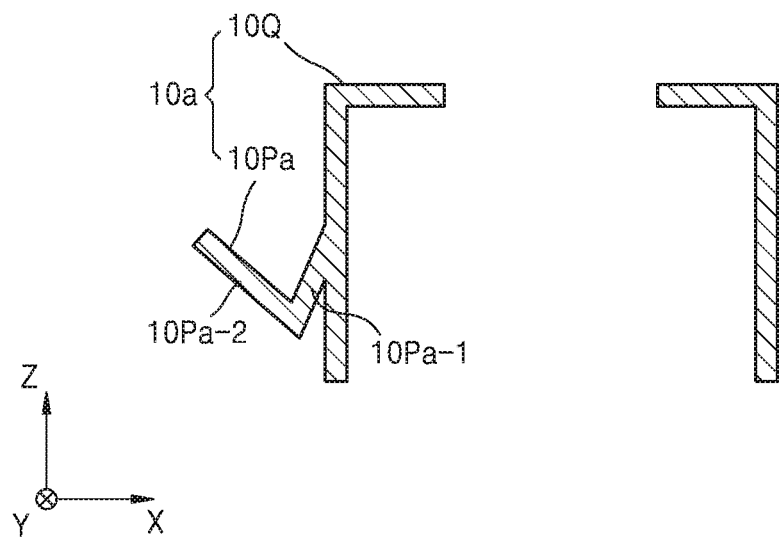
FIGS. 2A to 2D are cross-sectional views of shielding structures according to embodiments.
Figure 2B:
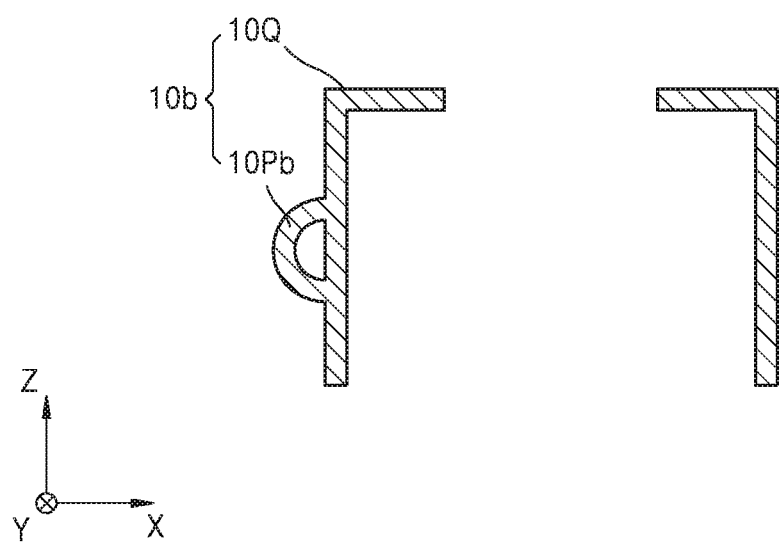
Figure 2C:
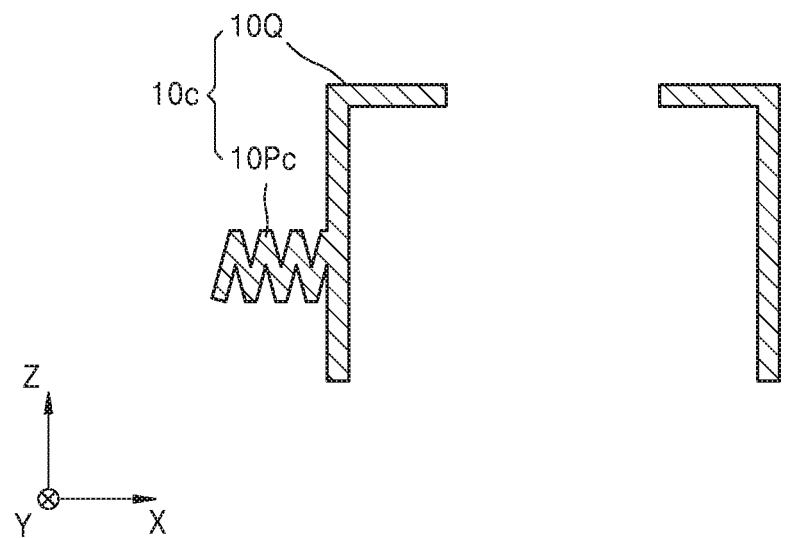

Referring to FIGS. 2A to 2D, protruding portions 10Pa to 10Pc of the shielding structures 10a to 10c may have various shapes. For example, although the protruding portion 10P of the shielding structure 10 illustrated in FIGS. 1A and 1B extends only in one direction, according to other embodiments, a protruding portion 10Pa of the shielding structure 10a illustrated in FIG. 2A may include a plurality of portions that extend in different directions. For example, the protruding portion 10Pa may include a first portion 10P-1 that extends from the accommodating portion 10Q outward (for example, in the −X direction) and downward (for example, in a −Z direction), and a second portion 10Pa-2 that extends outward (for example, in the −X direction) and upward (for example, in a +Z direction). In addition, although the protruding portion 10P of the shielding structure 10 illustrated in FIGS. 1A and 1B is straight, according to other embodiments, a protruding portion 10Pb of the shielding structure 10b may be curved as illustrated in FIG. 2B. In addition, in some embodiments, as illustrated in FIG. 2C, a protruding portion 10Pc of the shielding structure 10c may have a more complicated shape like a coil shape.

In some embodiments, the protruding portions 10Pa to 10Pc of the shielding structures 10a to 10c may function as springs. In other words, the protruding portions 10Pa to 10Pc of the shielding structures 10a to 10c may be deformed and may have structures in which an elastic force may be applied to the outside by the deformation. Therefore, the protruding portions 10Pa to 10Pc of the shielding structures 10a to 10c may maintain contact with the external structure (for example, the device housing 110 illustrated in FIG. 4 or the flange 170 illustrated in FIG. 14) by elasticity.

Figure 2D:
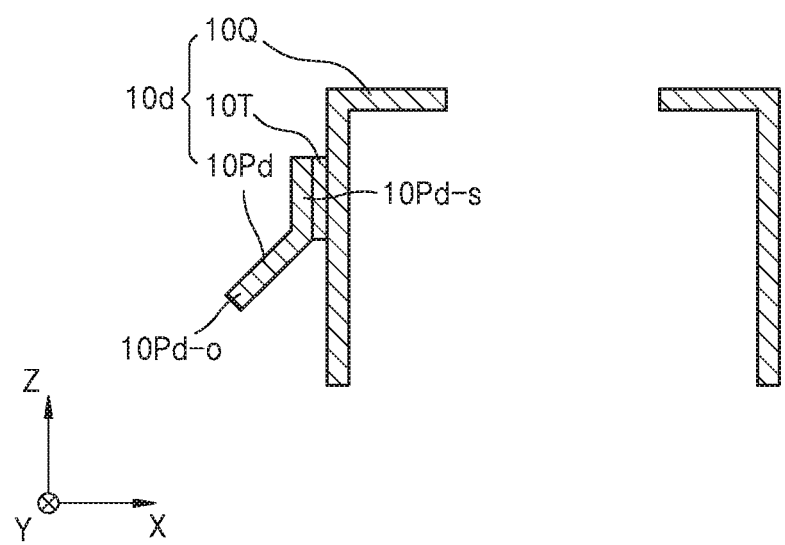

Referring to FIG. 2D, according to some embodiments, a shielding structure 10d may include an adhesive 10T and a protruding portion 10Pd. The adhesive 10T may attach the protruding portion 10Pd of the shielding structure 10d to the accommodating portion 10Q of the shielding structure 10d. In some embodiments, the protruding portion 10Pd may include a first surface 10Pd-s that faces the accommodating portion 10Q and a second surface 10Pd-o that extends outward from the accommodating portion 10Q (as in FIG. 1A), and the adhesive 10T may be between the accommodating portion 10Q and the first surface 10Pd-s of the protruding portion 10Pd that faces the accommodating portion 10Q, as illustrated in FIG. 2D. In other words, the adhesive 10T may be attached to a side wall of the accommodating portion 10Q, between the first surface 10Pd-s and the side wall of the accommodating portion 10Q. In this case, the adhesive 10T may include a conductive material. In other embodiments, unlike in FIG. 2D, the adhesive 10T may be positioned on outside of the second surface 10Pd-o of the protruding portion 10Pd that faces outward, and may extend over the accommodating portion 10Q of the shielding structure 10d. In other words, the adhesive portion may not be provided between the protruding portion 10Pd and the side wall of the accommodating portion 10Q, but rather may be attached to the outside of the protruding portion 10Pd and may wrap around the side wall and at least a portion of the top of the accommodating portion 10Q.

Figure 3A:
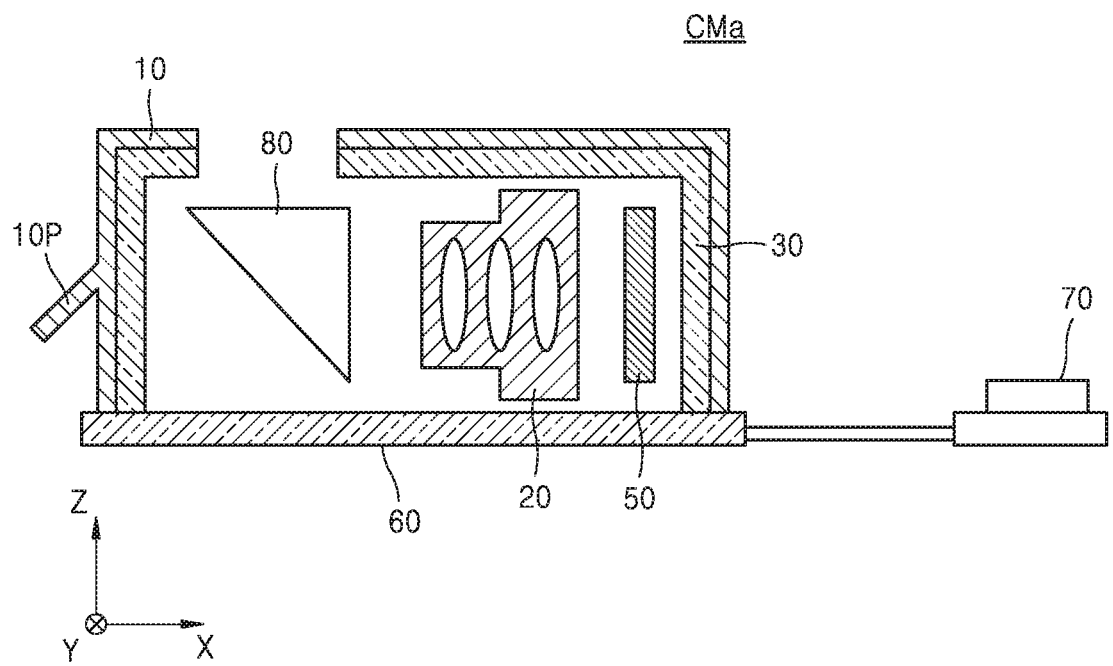
FIGS. 3A to 3B are cross-sectional views of camera modules according to embodiments.
Figure 3B:
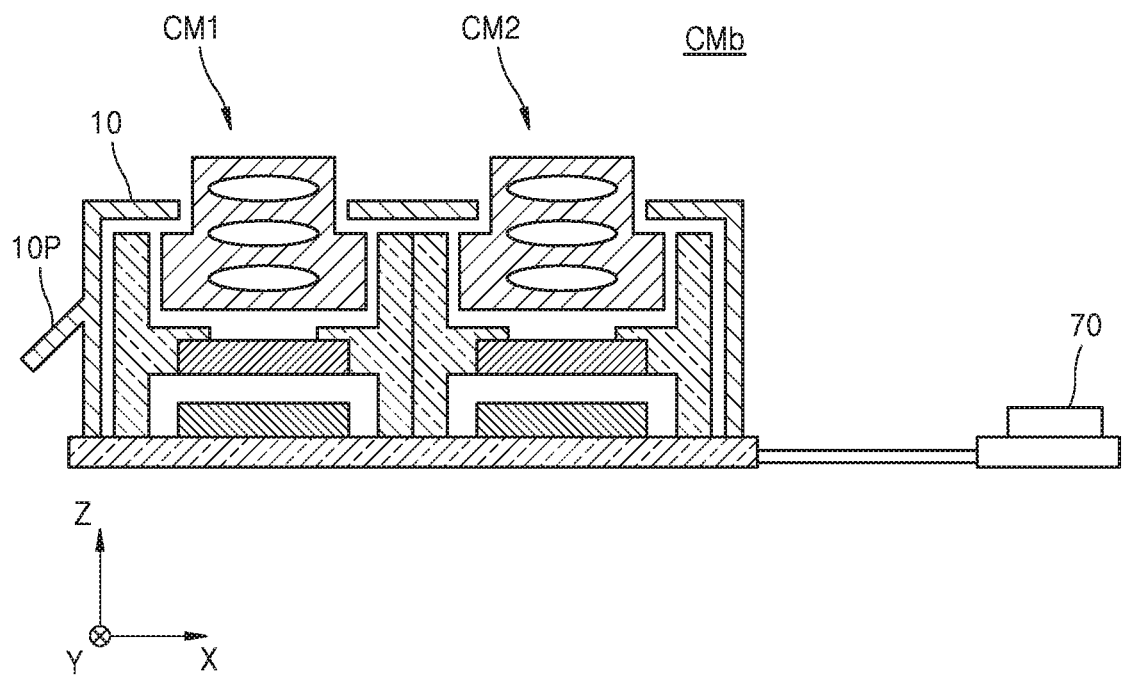

FIGS. 3A to 3B are cross-sectional views of camera modules CMa and CMb, respectively, according to embodiments.

Referring to FIG. 3A, the camera module CMa may further include a prism 80 positioned in the module housing 30. The prism 80 may change a traveling direction of light. Light may enter the prism 80 through openings or windows of the module housing 30 and the shielding structure 10 in a vertical direction (for example, the −Z direction) and may exit of the prism 80 in a horizontal direction (for example, an X direction). The lens assembly 20 is positioned in the module housing 30 and may be oriented so that an optical axis of the lens assembly 20 runs parallel with the horizontal direction (for example, the X direction). The image sensor 50 may be erected so as to receive light that travels in the horizontal direction (for example, the X direction). That is, pixel arrays of the image sensor 50 may face the horizontal direction (for example, the −X direction).

Referring to FIG. 3B, the camera module CMb may include a plurality of individual camera modules CM1 and CM2 and the plurality of individual camera modules CM1 and CM2 may share the shielding structure 10. In this configuration, the shielding structure 10 may include an opening or window corresponding to each of the plurality of individual camera modules CM1 and CM2, as illustrated in FIG. 3B. The camera module CMb may be referred to as a dual camera module.

Figure 4:
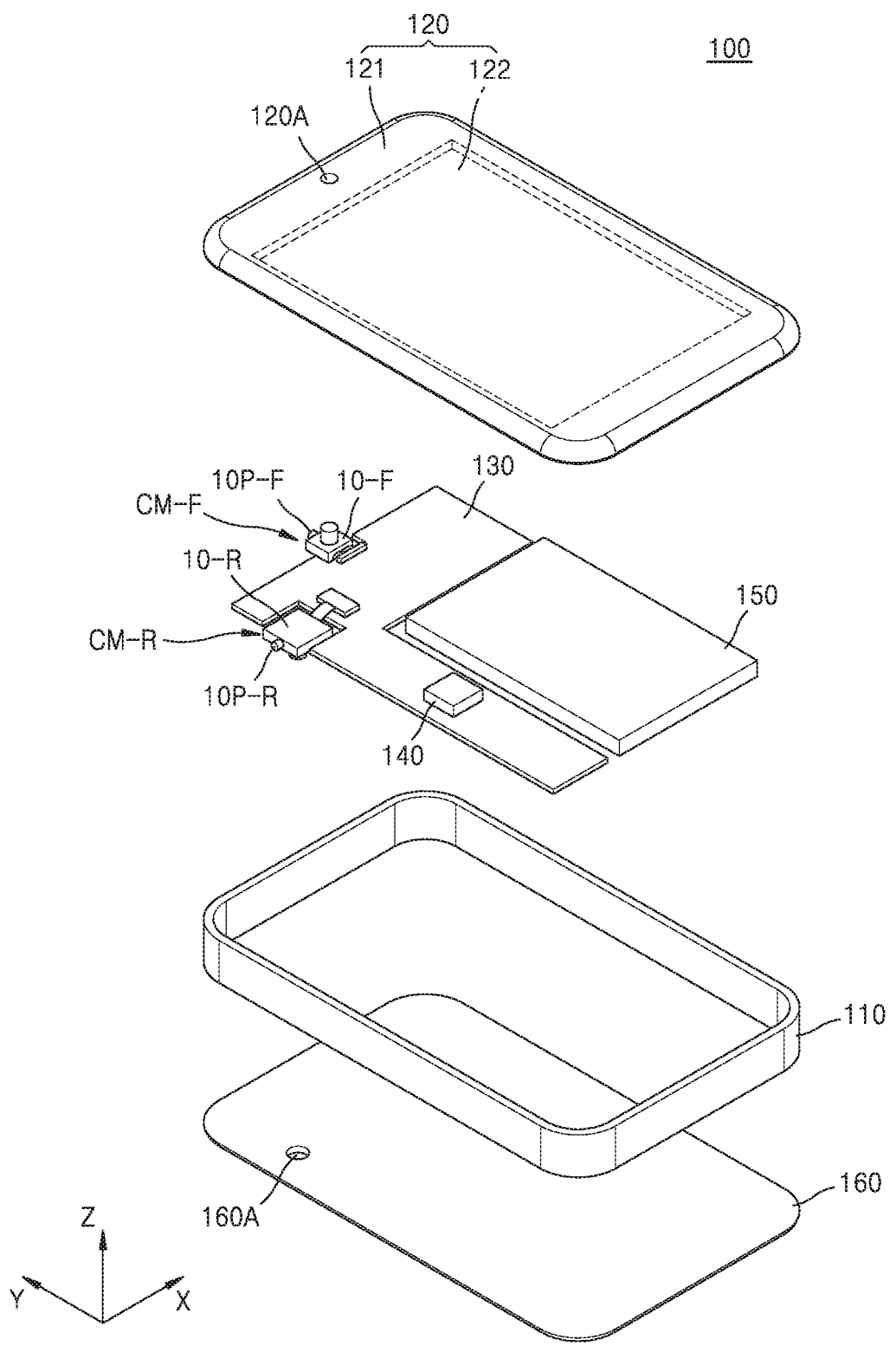
FIG. 4 is an exploded perspective view of an electronic device according to an embodiment.
Figure 5A:
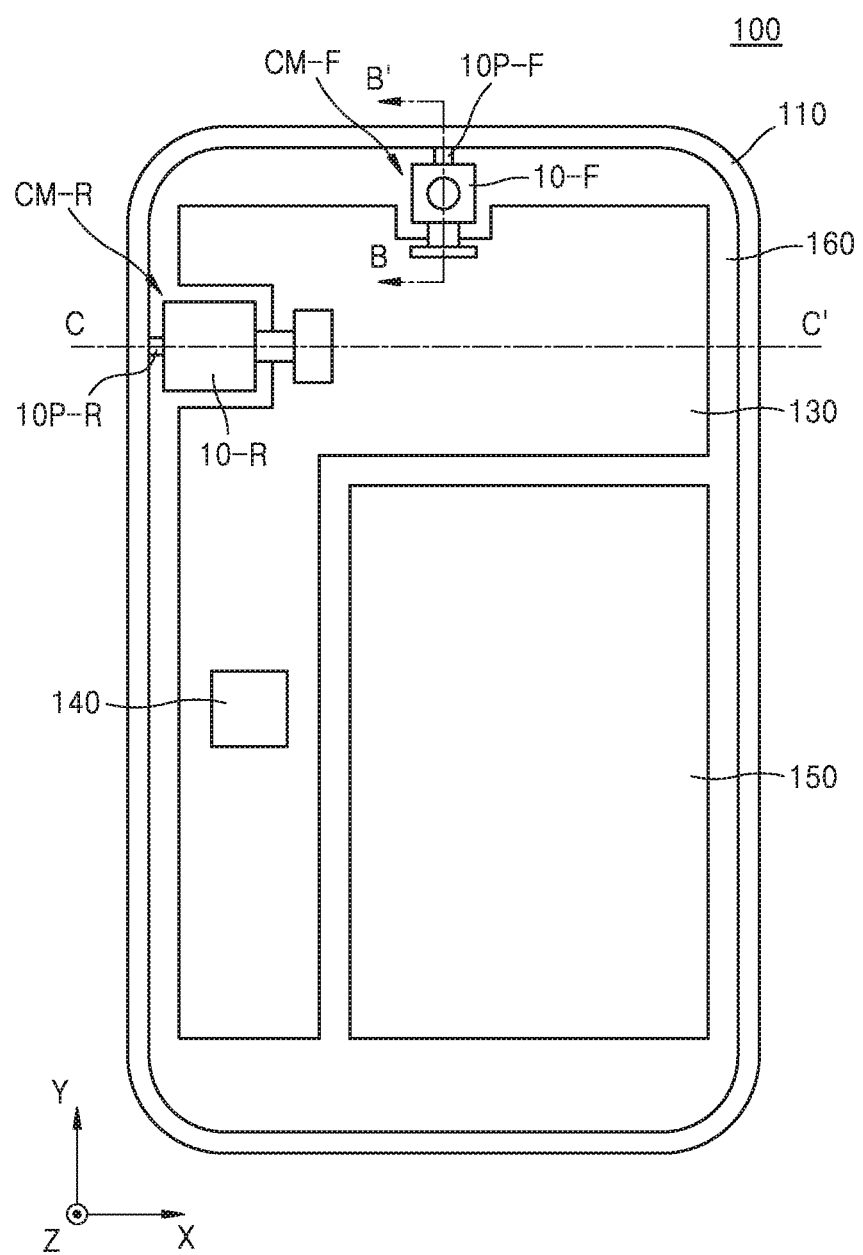
FIG. 5A is a plan view of an electronic device, from which a front panel is removed, according to an embodiment.
Figure 5B:
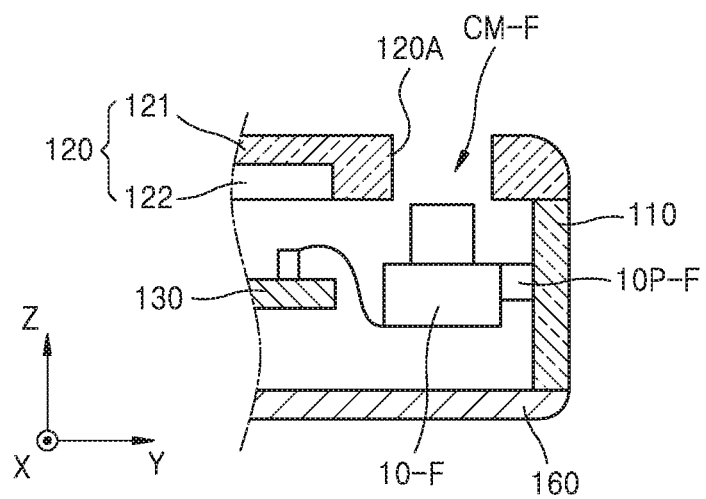
FIG. 5B is a cross-sectional view of an electronic device, which is taken along the line B-B' of FIG. 5A, according to an embodiment.
Figure 5C:
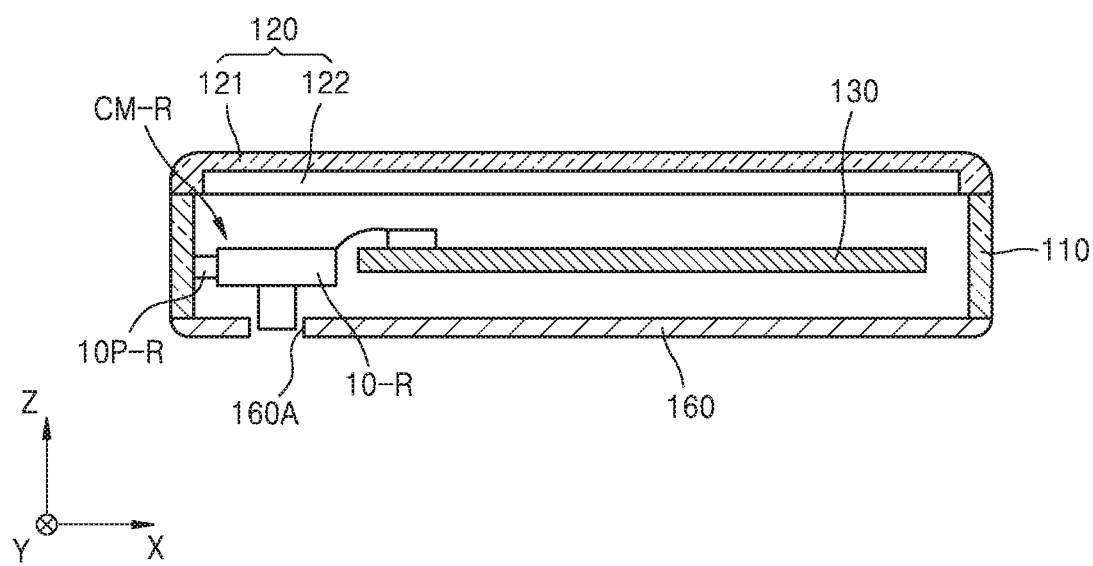
FIG. 5C is a cross-sectional view of an electronic device, which is taken along the line C-C' of FIG. 5A, according to an embodiment.

FIG. 4 is an exploded perspective view of an electronic device according to an embodiment. FIG. 5A is a plan view of the electronic device, from which a front panel is removed, according to an embodiment. FIG. 5B is a cross-sectional view of the electronic device, which is taken along the line B-B' of FIG. 5A. FIG. 5C is a cross-sectional view of the electronic device, which is taken along the line C-C' of FIG. 5A.

Hereinafter, a electronic device 100 is described by using a smart phone as an example. However, the electronic device 100 is not limited thereto. For example, the electronic device 100 may include an arbitrary portable electronic device such as a smart watch, smart glasses, a smart band, a tablet personal computer (PC), a personal digital assistant (PDA), a digital camera, or a game machine, an arbitrary home appliance such as a refrigerator, a washing machine, a drier, a vacuum cleaner, or a television set, an arbitrary transport unit such as a vehicle, a ship, or an airplane, an industrial electronic device, or a robot.

Referring to FIG. 4, for example, the electronic device 100 may include a main circuit board 130, a camera module (a front camera module CM-F and/or a rear camera module CM-R), an electronic component 140, a front panel 120, a rear panel 160, and a device housing 110.

The main circuit board 130 may include, for example, a PCB. The front camera module CM-F, the rear camera module CM-R, and the electronic component 140 may be connected to the main circuit board 130. Each of the front camera module CM-F and the rear camera module CM-R may be one of the camera modules CM, CMa, and CMb described with reference to FIGS. 1A to 3B. The front camera module CM-F may be oriented to face a front surface of the electronic device 100, that is, the front panel 120. The rear camera module CM-R may be oriented to face a rear surface of the electronic device 100, that is, the rear panel 160.

The electronic component 140 may include, for example, memory, a processor, and/or an interface. The memory may include, for example, dynamic random access memory (DRAM), static random access memory (SRAM), flash memory, electrically erasable and programmable read-only memory (EEPROM), phase-change random access memory (PRAM), magnetic random access memory (MRAM), and/or resistive random access memory (RRAM). The processor may include, for example, a central processing unit (CPU), a graphics processing unit (GPU), and/or an application processor (AP). The interface may include, for example, a high definition multimedia interface (HDMI), a universal serial bus (USB), an interface, a secure digital (SD) card interface, and/or an audio interface.

In some embodiments, the electronic device 100 may further include a battery 150 connected to the main circuit board 130. In some embodiments, although not shown in FIG. 4, the electronic device 100 may further include a communication module, a microphone, a speaker, a fingerprint sensor, a gyro-sensor, a bio-sensor, an illuminance sensor, a humidity sensor, a temperature sensor, and/or a flash light.

The front panel 120 and the rear panel 160 may face each other. The device housing 110 may be between the front panel 120 and the rear panel 160. The front panel 120, the device housing 110, and the rear panel 160 together may form an outer form of the electronic device 100. That is, the front panel 120, the device housing 110, and the rear panel 160 may be exposed to the outside of the electronic device 100. For example, the front panel 120 may form a front surface of the electronic device 100, the rear panel 160 may form a rear surface of the electronic device 100, and the device housing 110 may form a side surface of the electronic device 100.

The main circuit board 130, the front camera module CM-F, the rear camera module CM-R, the electronic component 140, and the battery 150 may be accommodated in a space formed by the front panel 120, the device housing 110, and the rear panel 160. The device housing 110 may include a side wall that, for example, two-dimensionally surrounds the space in which the main circuit board 130, the front camera module CM-F, the rear camera module CM-R, the electronic component 140, and the battery 150 are positioned. The front panel 120 and the rear panel 160 may cover the space in which the main circuit board 130, the front camera module CM-F, the rear camera module CM-R, the electronic component 140, and the battery 150 are positioned.

The front panel 120 may include a display 122. In addition, the front panel 120 may further include a front cover 121 including a transparent window on the display 122. The front panel 120 may further include a touch input panel (not shown) between the transparent window of the front cover 121 and the display 122. The front panel 120 may include an opening or a window 120A for the front camera module CM-F to receive light. The rear panel 160 may include an opening or a window 160A for the rear camera module CM-R to receive light.

The device housing 110 may accommodate the main circuit board 130, the front camera module CM-F, the rear camera module CM-R, the electronic component 140, and the battery 150. At least a portion of the device housing 110 may be conductive and may include a conductive material. For example, the device housing 110 may include a metal such as Cu, Al, Au, Ni, Ag, Fe, or a combination of the these metals.

Referring to FIGS. 5A to 5C, a protruding portion 10P-F of a shielding structure 10-F of the front camera module CM-F and a protruding portion 10P-R of a shielding structure 10-R of the rear camera module CM-R may contact the device housing 110. In some embodiments, the protruding portion 10P-F of the shielding structure 10-F of the front camera module CM-F and the protruding portion 10P-R of the shielding structure 10-R of the rear camera module CM-R may protrude in two-dimensionally different directions. For example, in some embodiments, a direction, in which the protruding portion 10P-F of the shielding structure 10-F of the front camera module CM-F protrudes, may be a +Y direction, and a direction, in which the protruding portion 10P-R of the shielding structure 10-R of the rear camera module CM-R protrudes, may be the −X direction. That is, a surface of the front camera module CM-F, on which the protruding portion 10P-F of the shielding structure 10-F of the front camera module CM-F is positioned, and a surface of the rear camera module CM-R, on which the protruding portion 10P-R of the shielding structure 10-R of the rear camera module CM-R is positioned, may face different directions. For example, the surface of the front camera module CM-F, on which the protruding portion 10P-F of the shielding structure 10-F of the front camera module CM-F is positioned, may face the +Y direction, and the surface of the rear camera module CM-R, on which the protruding portion 10P-R of the shielding structure 10-R of the rear camera module CM-R is positioned, may face the −X direction.

Figure 6:
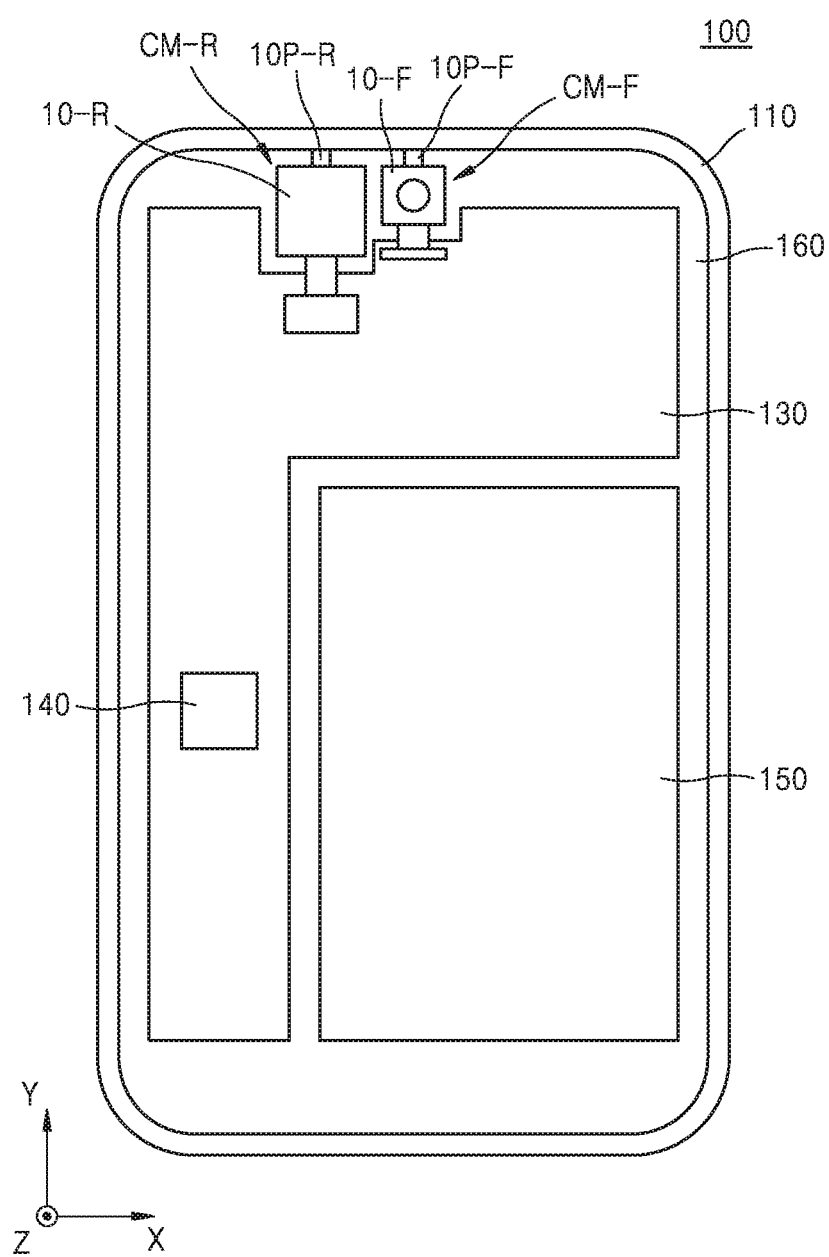
FIGS. 6 to 8 are plan views of electronic devices, from which a front panel is removed, according to embodiments.

FIG. 6 is a plan view of an electronic device, from which a front panel is removed, according to an embodiment.

Referring to FIG. 6, in some embodiments, the protruding portion 10P-F of the shielding structure 10-F of the front camera module CM-F and the protruding portion 10P-R of the shielding structure 10-R of the rear camera module CM-R may protrude in the two-dimensionally same direction. For example, a direction, in which the protruding portion 10P-F of the shielding structure 10-F of the front camera module CM-F protrudes, and a direction, in which the protruding portion 10P-R of the shielding structure 10-R of the rear camera module CM-R protrudes, may be the +Y direction. That is, the surface of the front camera module CM-F, on which the protruding portion 10P-F of the shielding structure 10-F of the front camera module CM-F is positioned, and the surface of the rear camera module CM-R, on which the protruding portion 10P-R of the shielding structure 10-R of the rear camera module CM-R is positioned, may face the same direction. For example, the surface of the front camera module CM-F, on which the protruding portion 10P-F of the shielding structure 10-F of the front camera module CM-F is positioned, and the surface of the rear camera module CM-R, on which the protruding portion 10P-R of the shielding structure 10-R of the rear camera module CM-R is positioned, may face the +Y direction.

Figure 7:
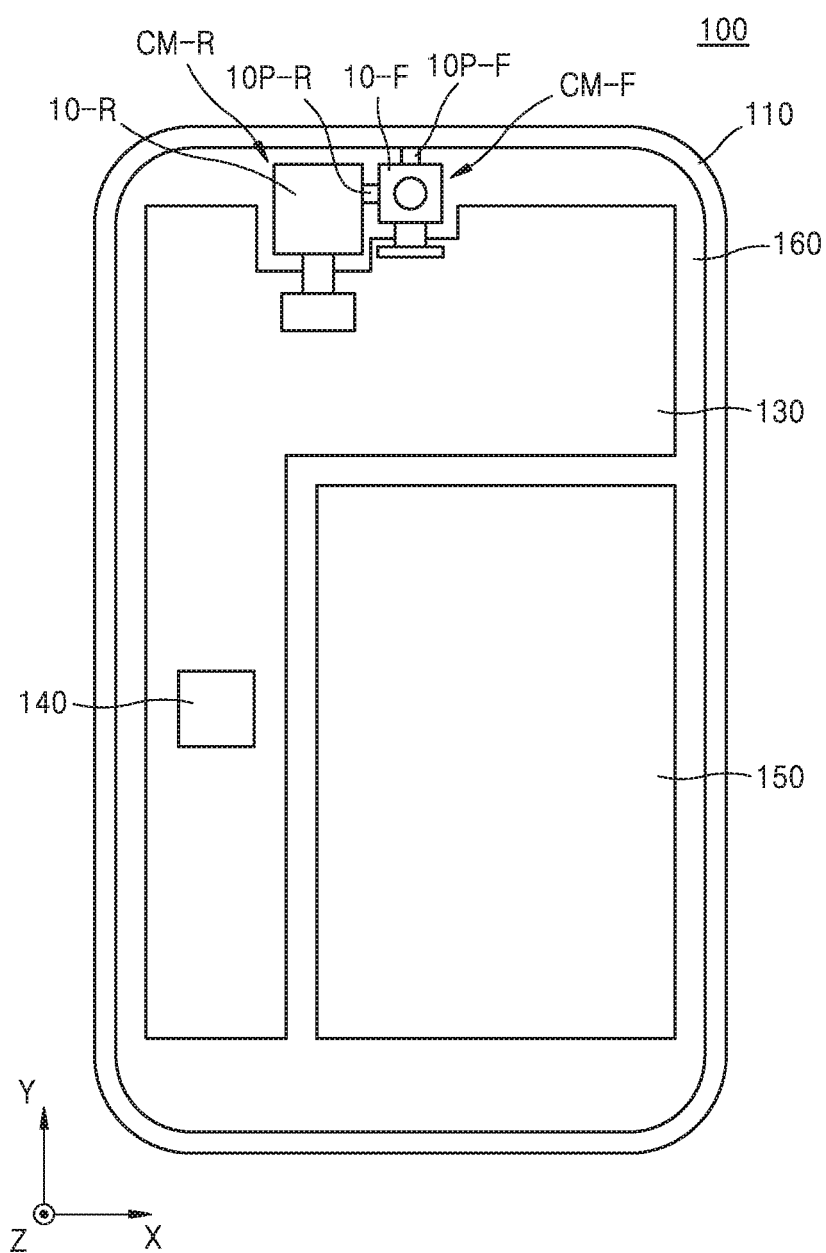

FIG. 7 is a plan view of an electronic device, from which a front panel is removed, according to an embodiment.

Referring to FIG. 7, in some embodiments, although the protruding portion 10P-F of the shielding structure 10-F of the front camera module CM-F contacts the device housing 110, the protruding portion 10P-R of the shielding structure 10-R of the rear camera module CM-R may not contact the device housing 110 and may contact the shielding structure 10-F of the front camera module CM-F. Therefore, the shielding structure 10-R of the rear camera module CM-R may be electrically connected to the device housing 110 through the shielding structure 10_F of the front camera module CM-F.

According to embodiments illustrated in FIG. 7, when the front camera module CM-F is to be arranged not to two-dimensionally overlap a display 122 of the front panel 120 but there are no such limitations on the arrangement of the rear camera module CM-R, although the rear camera module CM-R is arranged in a position remote from the side wall of the device housing 110, since the rear camera module CM-R may contact the shielding structure 10-F of the front camera module CM-F, the flexibility of an arrangement design of the rear camera module CM-R may increase.

Figure 8:
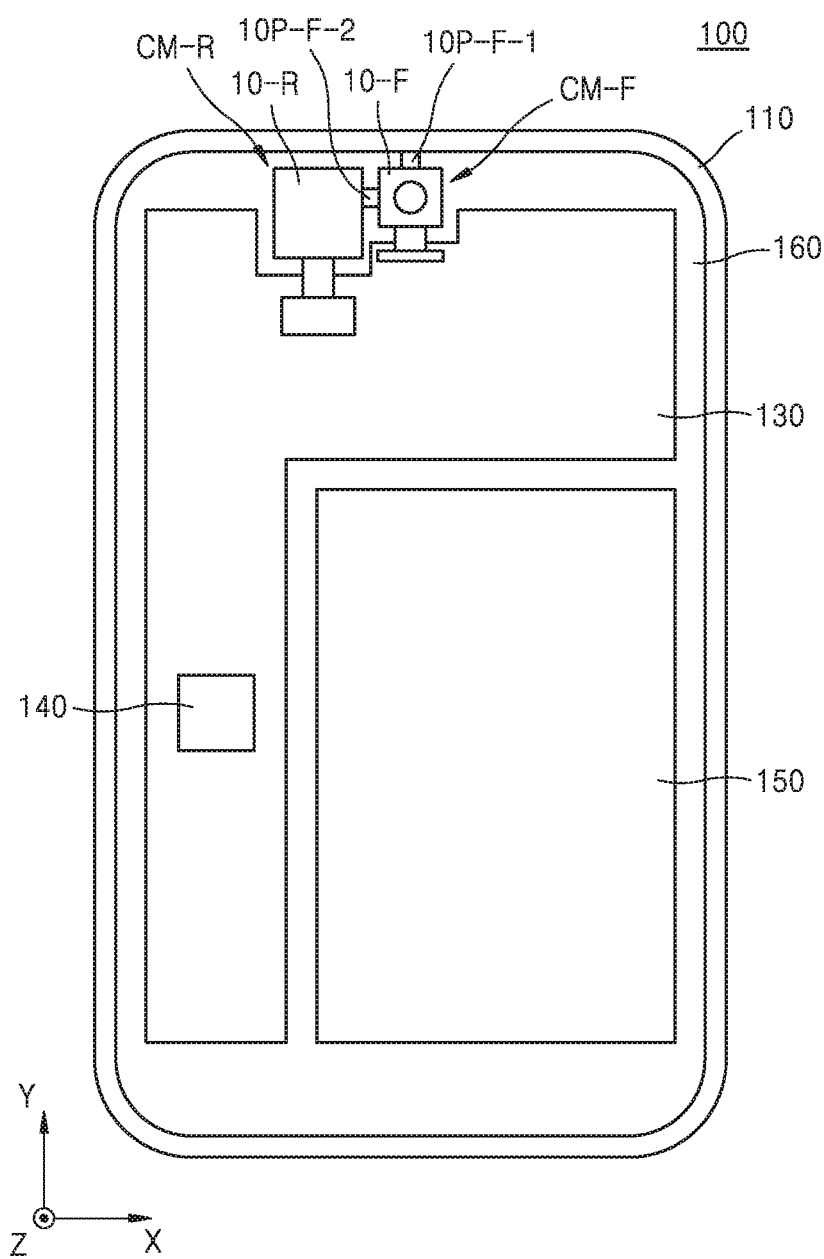

FIG. 8 is a plan view of an electronic, from which a front panel is removed, device according to an embodiment.

Referring to FIG. 8, the shielding structure 10-F of the front camera module CM-F includes two protruding portions, for example, a first protruding portion 10P-F-1 and a second protruding portion 10P-F-2, whereas the shielding structure 10-R of the rear camera module CM-R may include no protruding portion. The first protruding portion 10P-F-1 of the shielding structure 10-F of the front camera module CM-F may contact the device housing 110 and the second protruding portion 10P-F-2 of the shielding structure 10-F of the front camera module CM-F may contact the shielding structure 10-R of the rear camera module CM-R. Therefore, the shielding structure 10-R of the rear camera module CM-R may be electrically connected to the device housing 110 through the shielding structure 10-F of the front camera module CM-F.

According to embodiments illustrated in FIG. 8, when a manufacturer of the electronic device 100 purchases only the front camera module CM-F including the shielding structure 10-F including the two protruding portions, for example, first and second protruding portions 10P-F-1 and 10P-F-2, the rear camera module CM-R including the shielding structure 10-R that includes no protruding portion may also be used, which is economical. Furthermore, when the front camera module CM-F is to be arranged not to two-dimensionally overlap the display 122 of the front panel 120 but there are no such limitations on the arrangement of the rear camera module CM-R, although the rear camera module CM-R is arranged in a position remote from the side wall of the device housing 110, since the rear camera module CM-R may contact the shielding structure 10-F of the front camera module CM-F, the flexibility of an arrangement design of the rear camera module CM-R may increase.

Figure 9:
FIG. 9 is a cross-sectional view of a device housing according to an embodiment.

FIG. 9 is a cross-sectional view of a device housing according to an embodiment.

Referring to FIG. 9, in some embodiments, the device housing 110 may include a conductive body 111 and an insulating coating 112 on the conductive body 111. The conductive body 111 may include any conductive material, for example, a metal such as Cu, Al, Au, Ni, Ag, Fe, or a combination of these metals. The insulating coating 112 may include, for example, a polymer. The protruding portions 10P-F and 10P-R of the shielding structures 10-F and 10-R of the camera modules CM-F and CM-R may contact the conductive body 111 of the device housing 110. For example, the insulating coating 112 of the device housing 110 may expose at least a portion of the conductive body 111 of the device housing 110 and the protruding portions 10P-F and 10P-R of the shielding structures 10-F and 10-R of the camera modules CM-F and CM-R illustrated in FIGS. 5A to 5C may contact the exposed portion of the conductive body 111 of the device housing 110. Alternatively, the protruding portions 10P-F and 10P-R of the shielding structures 10-F and 10-R of the camera modules CM-F and CM-R illustrated in FIGS. 5A to 5C may pass through the insulating coating 112 of the device housing 110 and may contact the conductive body 111 of the device housing 110.

Figure 10:
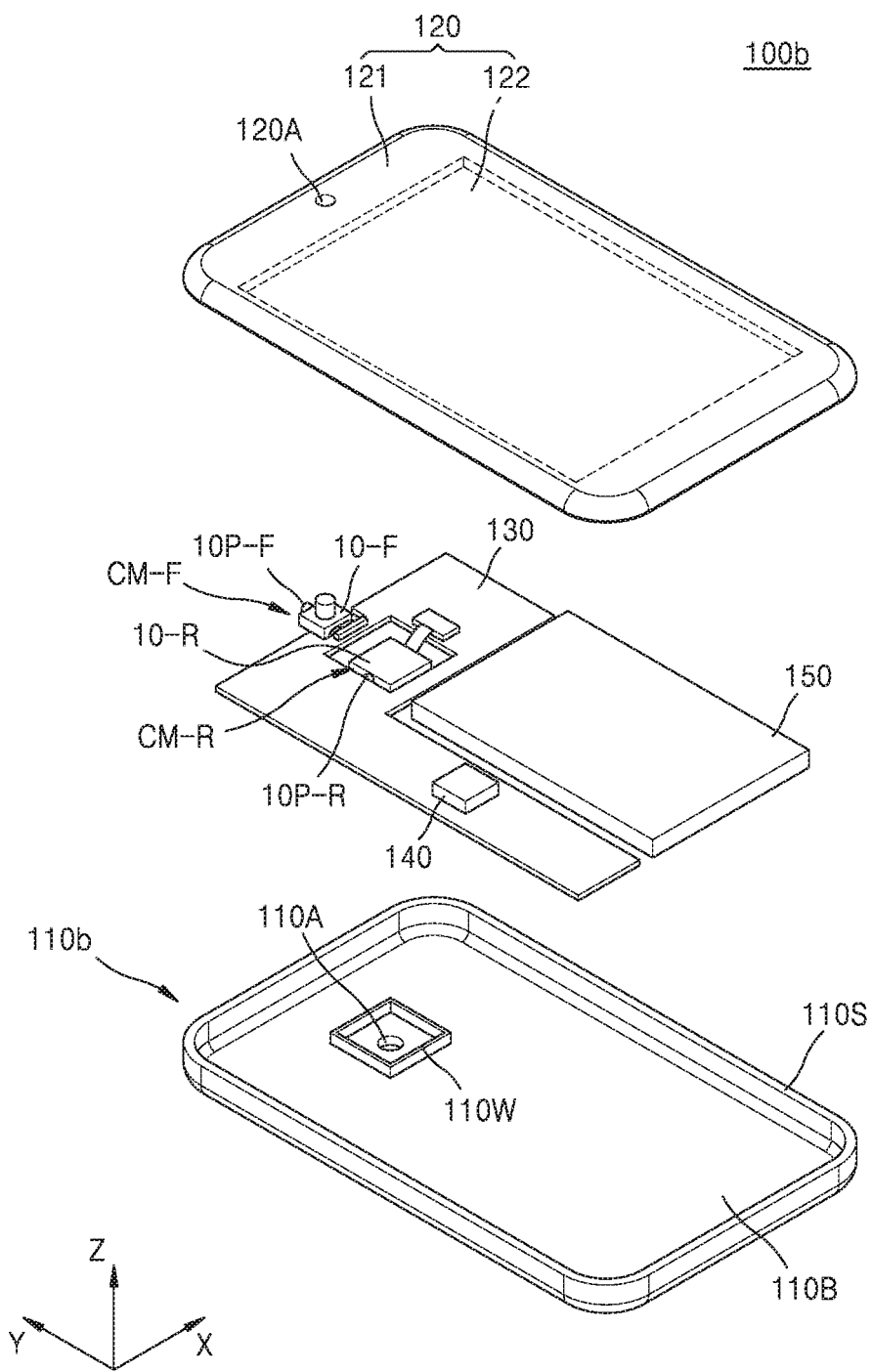
FIG. 10 is an exploded perspective view of an electronic device according to an embodiment.
Figure 11A:
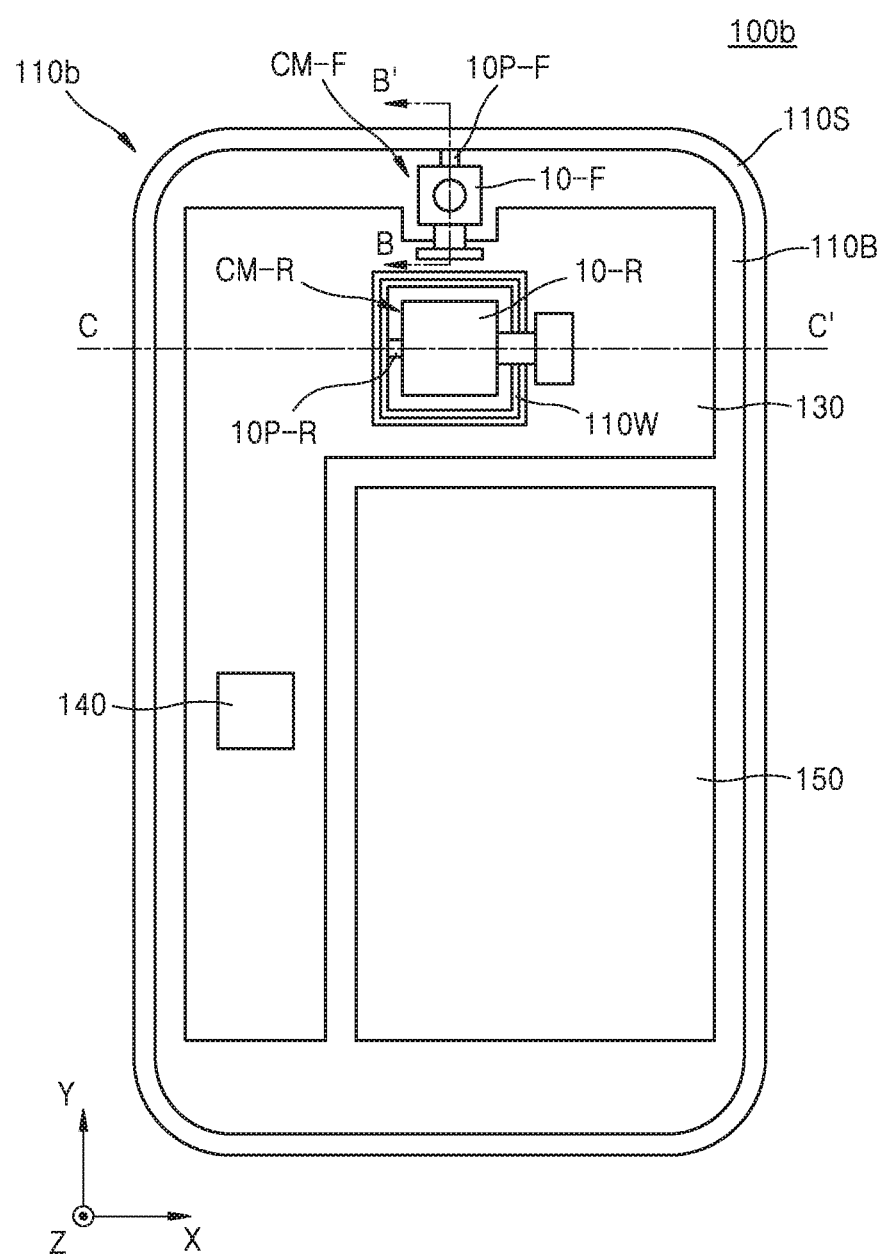
FIG. 11A is a plan view of an electronic device, from which a front panel is removed, according to an embodiment.
Figure 11B:
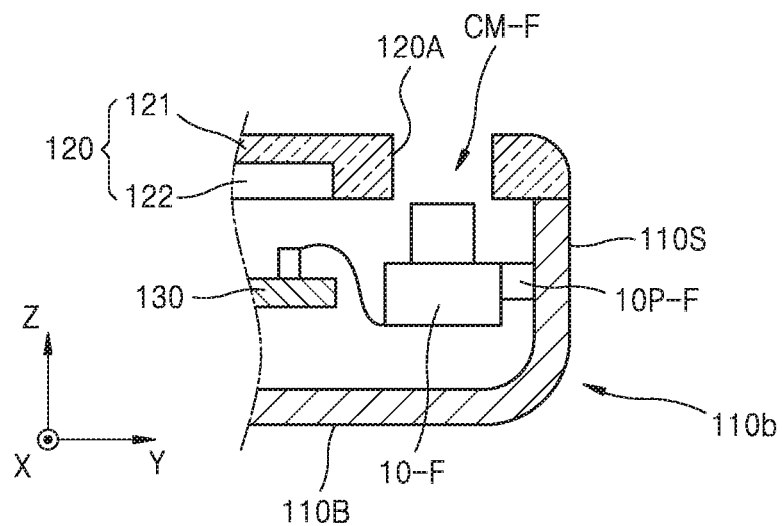
FIG. 11B is a cross-sectional view of an electronic device, which is taken along the line B-B' of FIG. 11A, according to an embodiment.
Figure 11C:
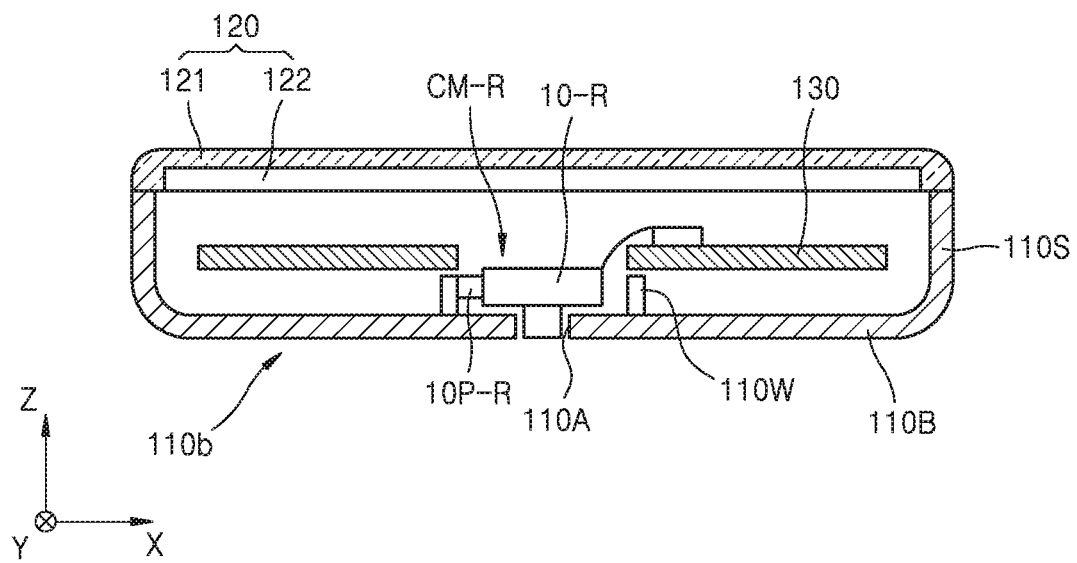
FIG. 11C is a cross-sectional view of an electronic device, which is taken along the line C-C' of FIG. 11A, according to an embodiment.

FIG. 10 is an exploded perspective view of an electronic device according to an embodiment. FIG. 11A is a plan view of the electronic device, from which a front panel is removed, according to an embodiment. FIG. 11B is a cross-sectional view of the electronic device, which is taken along the line B-B' of FIG. 11A. FIG. 11C is a cross-sectional view of the electronic device 100b, which is taken along the line C-C' of FIG. 11A.

Referring to FIG. 10, in comparison with the electronic device 100 illustrated in FIG. 4, an electronic device 100b may omit the rear panel 160 illustrated in FIG. 4 and may include a device housing 110b that is different from the device housing 110 illustrated in FIG. 4. In comparison with the device housing 110 illustrated in FIG. 4, the device housing 110b may further include a bottom 110B. The bottom 110B of the device housing 110b may face the front panel 120 and may be apart from the front panel 120. A side wall 110S of the device housing 110b may be between the front panel 120 and the bottom 110B of the device housing 110b. The device housing 110b may form at least a portion of an external form of the electronic device 100b. The bottom 110B of the device housing 110b may form a rear surface of the electronic device 100b and the side wall 110S of the device housing 110b may form a side surface of the electronic device 100b.

The main circuit board 130, the front camera module CM-F, the rear camera module CM-R, the electronic component 140, and the battery 150 may be accommodated in a space formed by the front panel 120 and the device housing 110b. The side wall 110S of the device housing 110b may, for example, two-dimensionally surround the space in which the main circuit board 130, the front camera module CM-F, the rear camera module CM-R, the electronic component 140, and the battery 150 are positioned. The bottom 110B of the device housing 110b may cover the space in which the main circuit board 130, the front camera module CM-F, the rear camera module CM-R, the electronic component 140, and the battery 150 are positioned. The bottom 110B of the device housing 110b may include an opening or a window 110A through which the rear camera module CM-R receives light.

In some embodiments, the device housing 110b may further include an internal wall 110W positioned on the bottom 110B of the device housing 110b and in the space surrounded by the side wall 110S of the device housing 110b. The internal wall 110W of the device housing 110b may extend from the bottom 110B of the device housing 110b toward the front panel 120, for example, upward (in the +Z direction). The internal wall 110W of the device housing 110b may be positioned around the opening or window 110A of the bottom 110B of the device housing 110b. In addition, the internal wall 110W of the device housing 110b may be positioned around the rear camera module CM-R. In some embodiments, the internal wall 110W of the device housing 110b may two-dimensionally and completely surround the rear camera module CM-R.

Referring to FIGS. 11A to 11C, the protruding portion 10P-F of the shielding structure 10-F of the front camera module CM-F may contact the side wall 110S of the device housing 110b, whereas the protruding portion 10P-R of the shielding structure 10-R of the rear camera module CM-R may contact the internal wall 110W of the device housing 110b. When the front camera module CM-F is to be arranged not to two-dimensionally overlap the display 122, since the front camera module CM-F is close to the side wall 110S of the device housing 110b, it is advantageous for the front camera module CM-F to contact the side wall 110S of the device housing 110b. On the other hand, although the rear camera module CM-R is arranged in a position remote from the side wall 110S of the device housing 110b, since the rear camera module CM-R may contact the internal wall 110W of the device housing 110b, the flexibility of an arrangement design of the rear camera module CM-R may increase.

Figure 12:
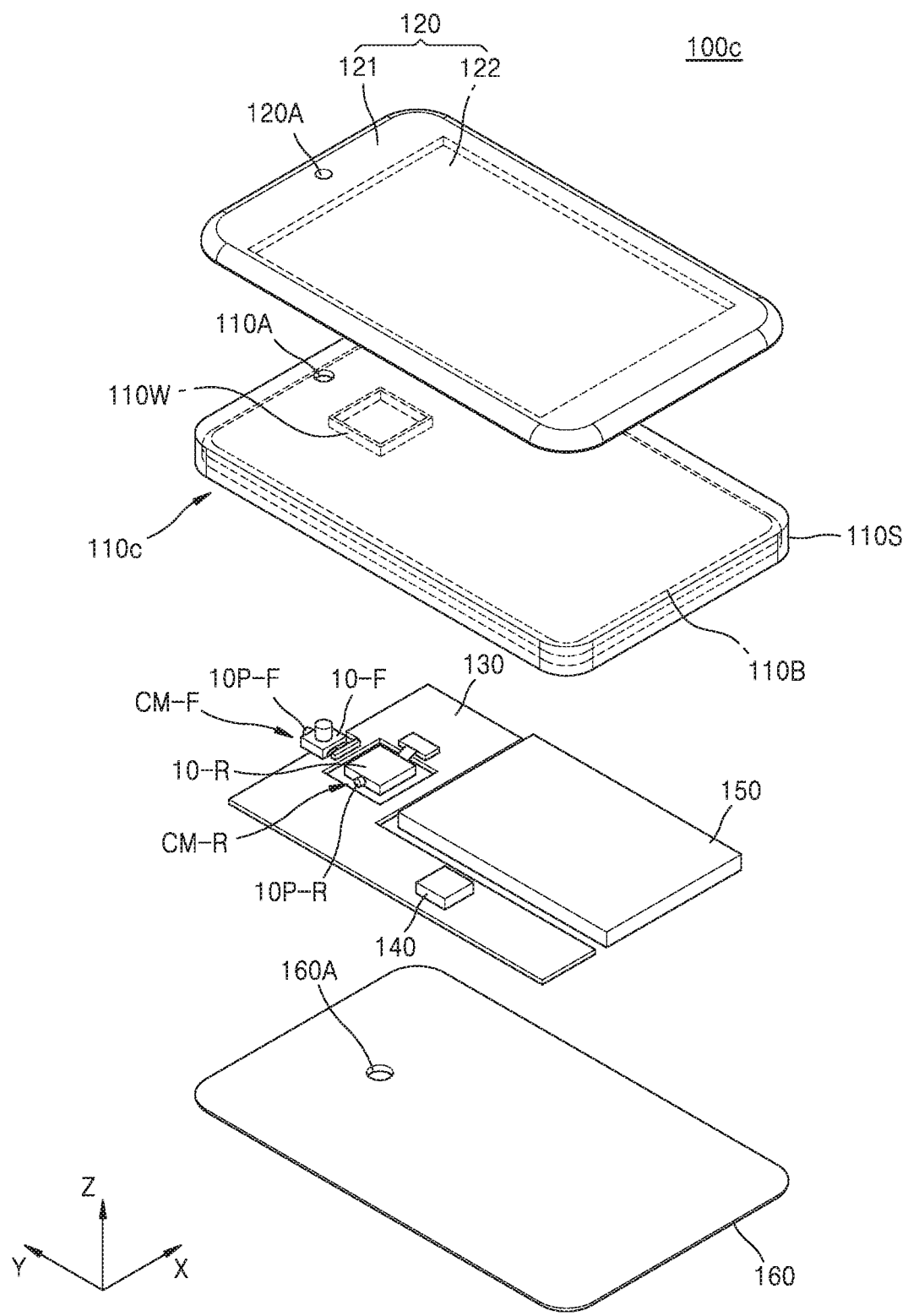
FIG. 12 is an exploded perspective view of an electronic device according to an embodiment.
Figure 13A:
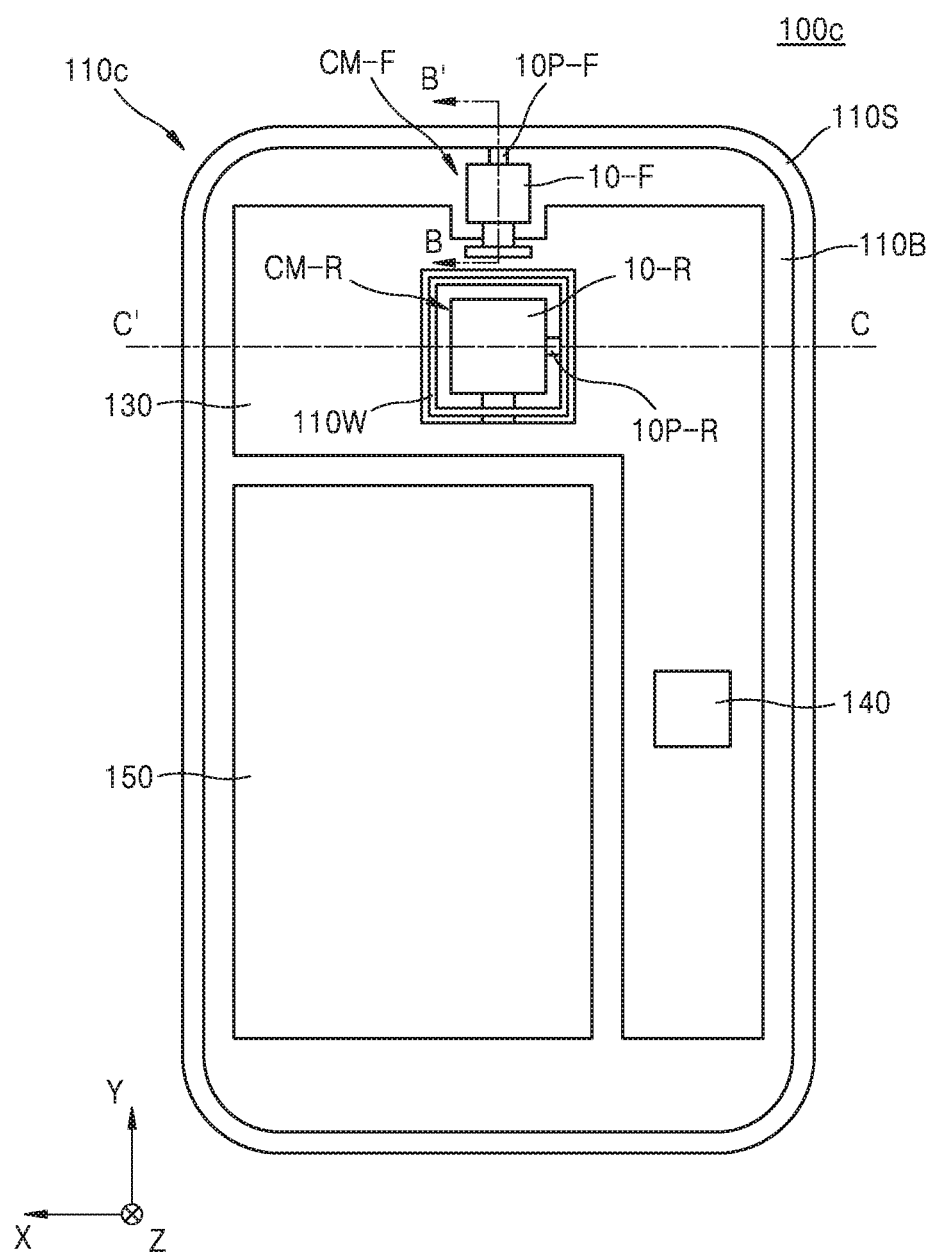
FIG. 13A is a plan view of an electronic device, from which a rear panel is removed, according to an embodiment.
Figure 13B:
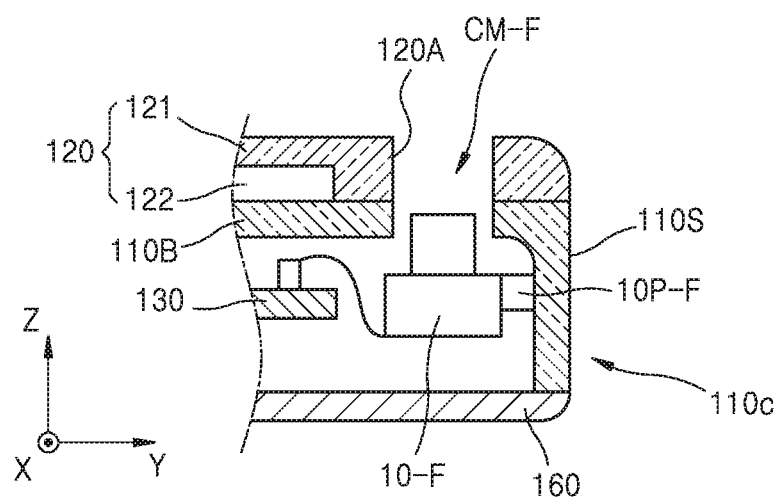
FIG. 13B is a cross-sectional view of an electronic device, which is taken along the line B-B' of FIG. 13A, according to an embodiment.
Figure 13C:
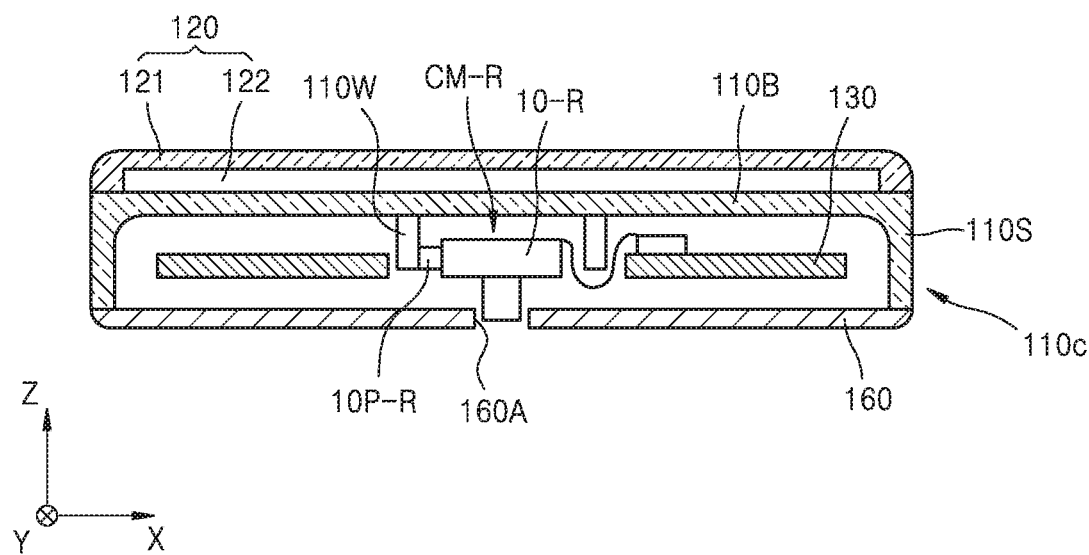
FIG. 13C is a cross-sectional view of an electronic device, which is taken along the line C-C' of FIG. 13A, according to an embodiment.

FIG. 12 is an exploded perspective view of an electronic device according to an embodiment. FIG. 13A is a plan view of the electronic device, from which a rear panel is removed, according to an embodiment. FIG. 13B is a cross-sectional view of the electronic device, which is taken along the line B-B' of FIG. 13A. FIG. 13C is a cross-sectional view of the electronic device, which is taken along the line C-C' of FIG. 13A.

Referring to FIGS. 12 and 13A to 13C, in comparison with the electronic device 100b illustrated in FIG. 10, an electronic device 100c may include a device housing 110c instead of the device housing 110b illustrated in FIG. 10 and may further include the rear panel 160 illustrated in FIG. 4. The device housing 110c may have a structure in which the device housing 110b illustrated in FIG. 10 is reversed. That is, the bottom 110B of the device housing 110c may be positioned on the front panel 120, may face the rear panel 160, and may be apart from the rear panel 160. The side wall 110S of the device housing 110c may be between the rear panel 160 and the bottom 110B of the device housing 110c.

Through the opening or window 110A of the device housing 110c, not the rear camera module CM-R but the front camera module CM-F may receive light. The internal wall 110W of the device housing 110c may extend from the bottom 110B of the device housing 110c toward the rear panel 160, for example, downward (in the −Z direction). The internal wall 110W of the device housing 110c may not be positioned around the opening or window 110A of the bottom 110B of the device housing 110b but may be positioned around the rear camera module CM-R. In some embodiments, the internal wall 110W of the device housing 110c may two-dimensionally and completely surround the rear camera module CM-R.

Figure 14:
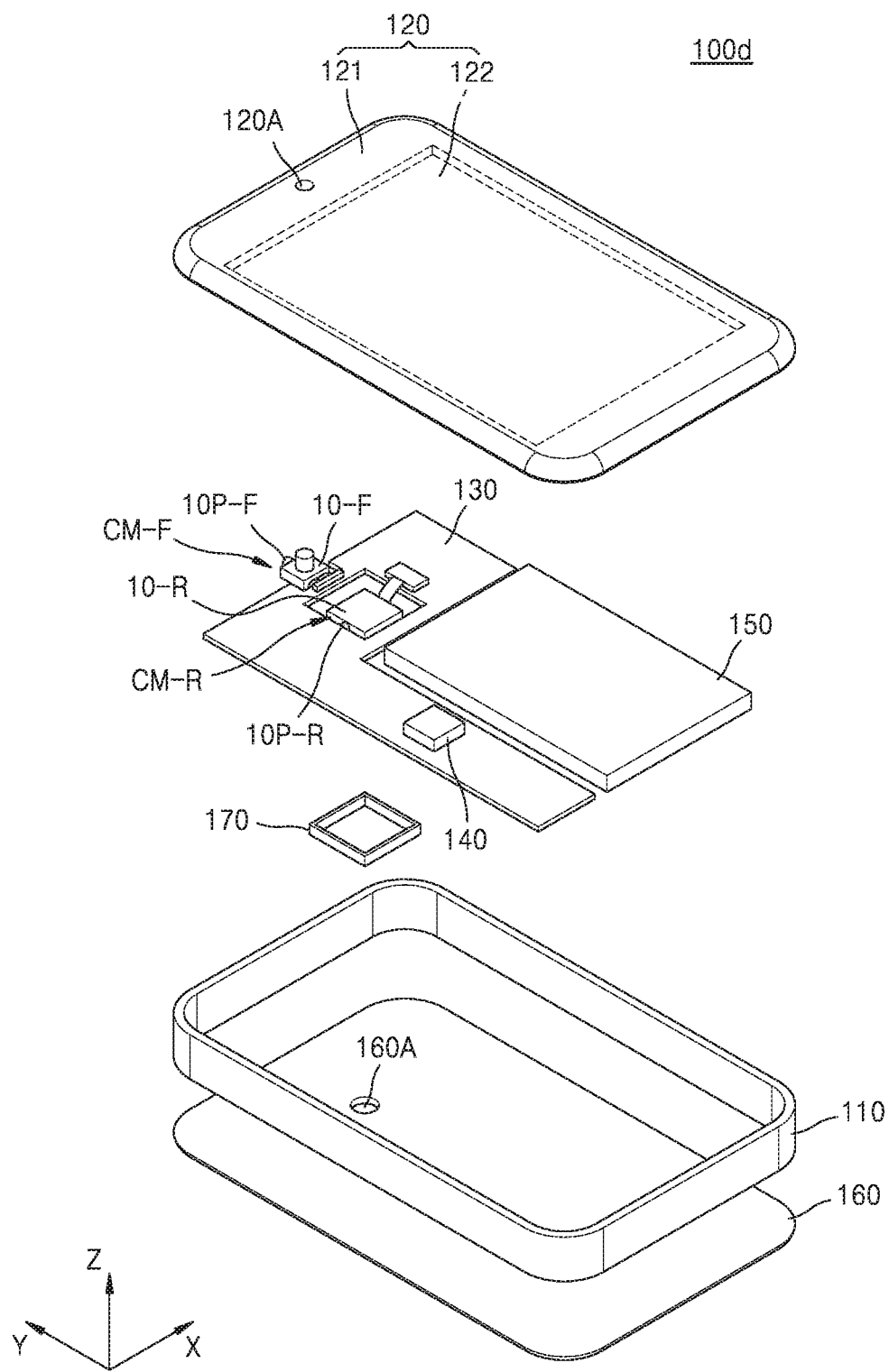
FIG. 14 is an exploded perspective view of an electronic device according to an embodiment.
Figure 15A:
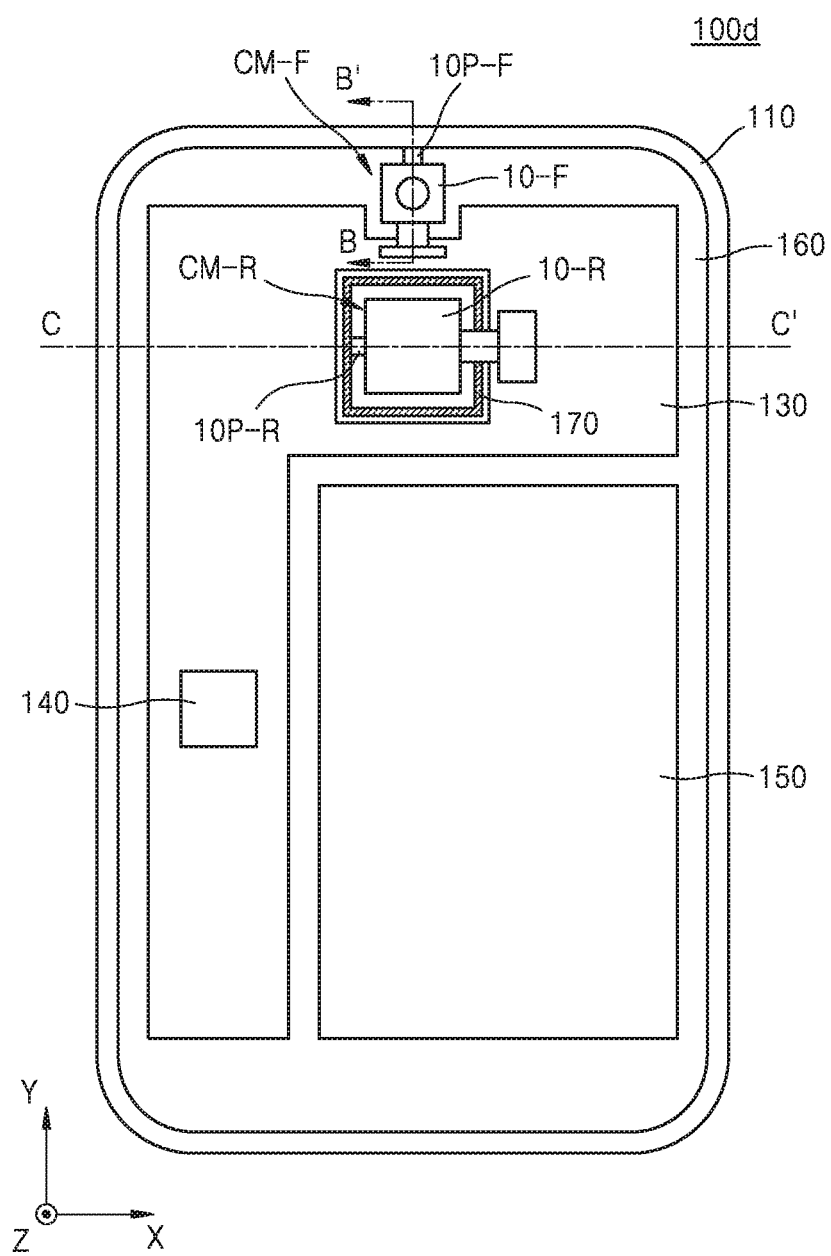
FIG. 15A is a plan view of an electronic device, from which a front panel is removed, according to an embodiment.
Figure 15B:
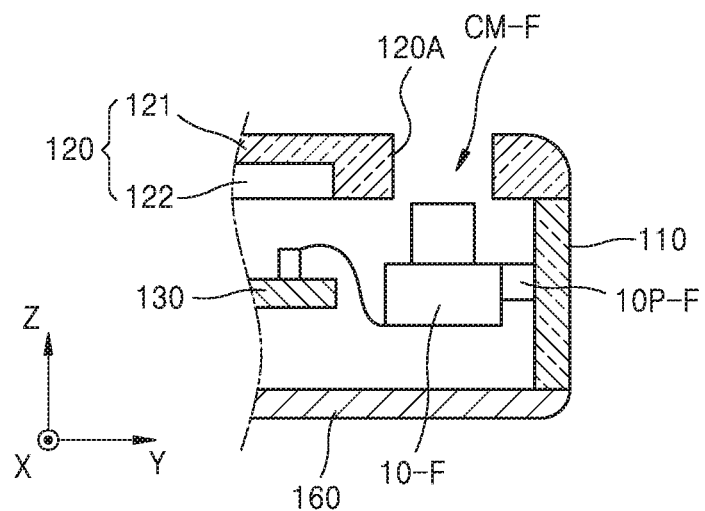
FIG. 15B is a cross-sectional view of an electronic device, which is taken along the line B-B' of FIG. 15A, according to an embodiment.
Figure 15C:
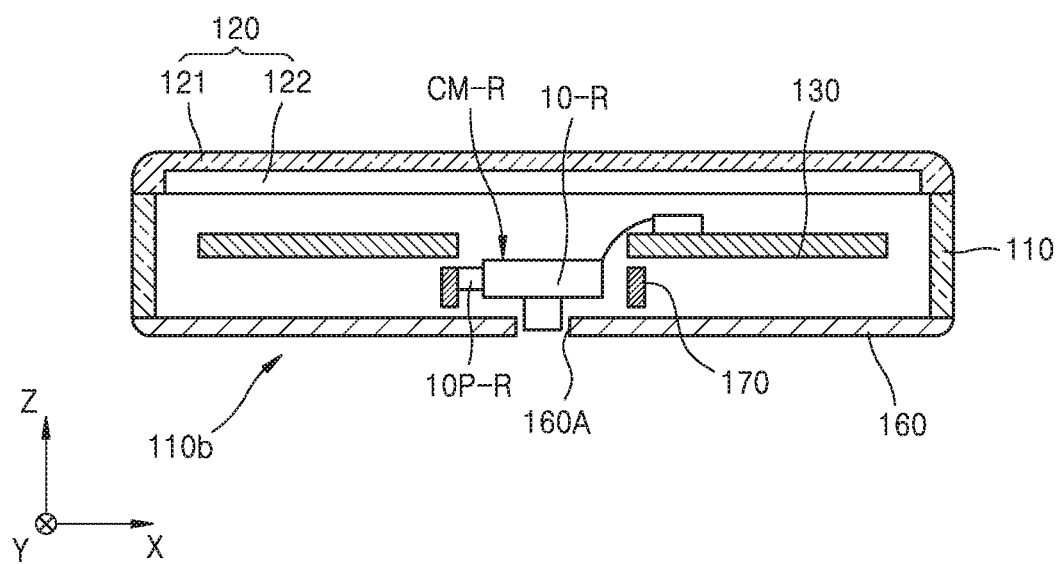
FIG. 15C is a cross-sectional view of an electronic device, which is taken along the line C-C' of FIG. 15A, according to an embodiment.

FIG. 14 is an exploded perspective view of an electronic device according to an embodiment. FIG. 15A is a plan view of the electronic device, from which a front panel is removed, according to an embodiment. FIG. 15B is a cross-sectional view of the electronic device, which is taken along the line B-B' of FIG. 15A. FIG. 15C is a cross-sectional view of the electronic device, which is taken along the line C-C' of FIG. 15A.

Referring to FIG. 14, unlike the electronic device 100 illustrated in FIG. 4, an electronic device 100d may further include a flange 170 accommodated in the device housing 110. The flange 170 may not be exposed to the outside of the electronic device 100d. The flange 170 may surround the rear camera module CM-R. The flange 170 may be conductive and may include a conductive material. For example, the flange 170 may include a metal such as Cu, Al, Au, Ni, Ag, Fe, or a combination of these metals.

Referring to FIGS. 15A to 15C, the protruding portion 10P-F of the shielding structure 10-F of the front camera module CM-F may contact the device housing 110, whereas the protruding portion 10P-R of the shielding structure 10-R of the rear camera module CM-R may contact the flange 170. When the front camera module CM-F is to be arranged not to two-dimensionally overlap the display 122, since the front camera module CM-F is close to the side wall of the device housing 110, it is advantageous for the front camera module CM-F to contact the side wall of the device housing 110. On the other hand, although the rear camera module CM-R is arranged in a position remote from the side wall of the device housing 110, since the rear camera module CM-R may contact the flange 170, the flexibility of an arrangement design of the rear camera module CM-R may increase.

Figure 16:
FIG. 16 is a cross-sectional view of a flange according to an embodiment.

FIG. 16 is a cross-sectional view of a flange according to an embodiment.

Referring to FIG. 16, in some embodiments, the flange 170 may include a conductive body 171 and an insulating coating 172 provided on the conductive body 171. The conductive body 171 may include a metal such as Cu, Al, Au, Ni, Ag, Fe, or a combination of these metals. The insulating coating 172 may include, for example, a polymer.

The protruding portion 10P-R of the shielding structure 10-R of the rear camera module CM-R illustrated in FIGS. 15A to 15C may contact the conductive body 171 of the flange 170. While FIGS. 15A-15C illustrate the flange 170 surrounding the rear camera module CM-R, embodiments are not limited thereto and, in some other embodiments, the flange 170 may be positioned alternatively to surround the front camera module CM-F, and the protruding portion 10P-F of the shielding structure 10-F of the camera module CM-F may alternatively contact the conductive body 171 of the flange 170. In some embodiments, the insulating coating 172 of the flange 170 may expose at least a portion of the conductive body 171 of the flange 170 and the protruding portion 10P-R of the shielding structure 10-R of the rear camera module CM-R illustrated in FIGS. 15A to 15C may contact the exposed portion of the conductive body 171 of the flange 170. Alternatively, in other embodiments, the protruding portion 10P-R of the shielding structure 10-R of the rear camera module CM-R illustrated in FIGS. 15A to 15C may pass through the insulating coating 172 of the flange 170 and contact the conductive body 171 of the flange 170.

Figure 17A:
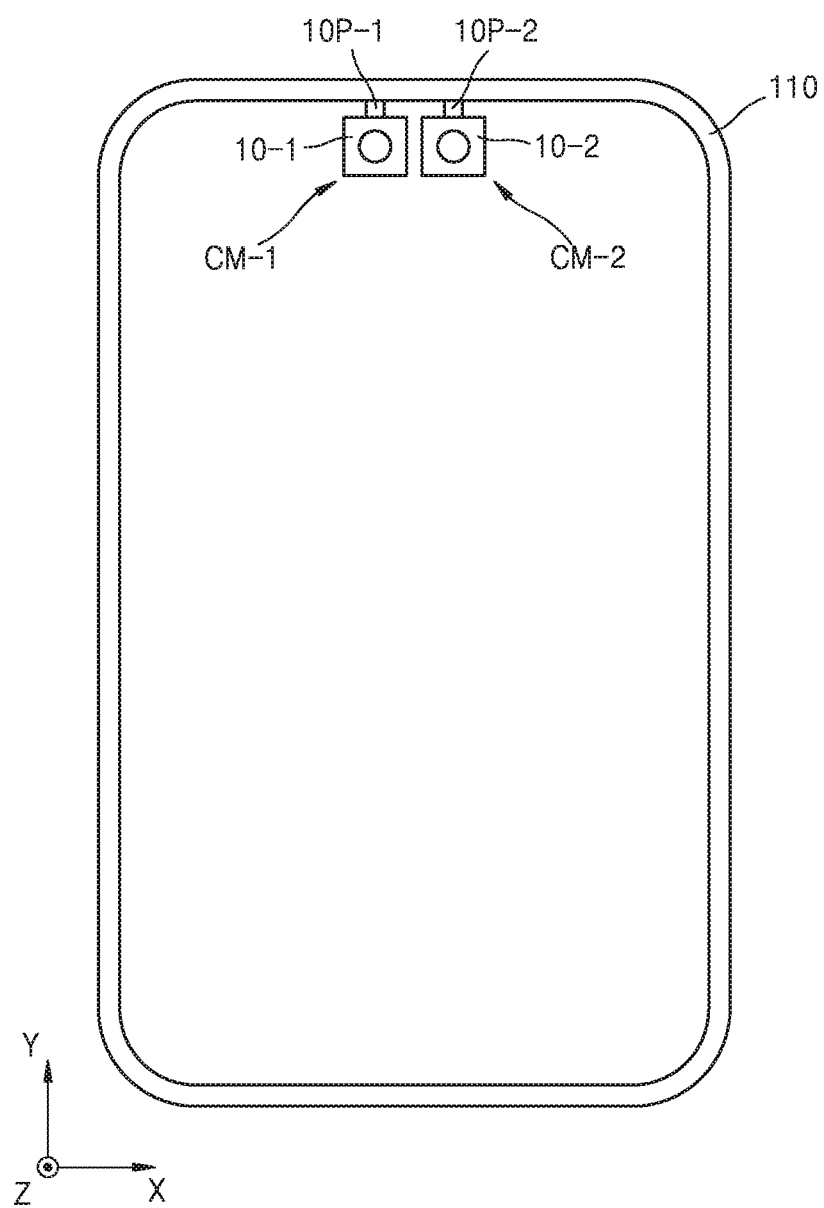
FIGS. 17A to 17C are plan views illustrating a device housing and camera modules in electronic devices according to embodiments.
Figure 17B:
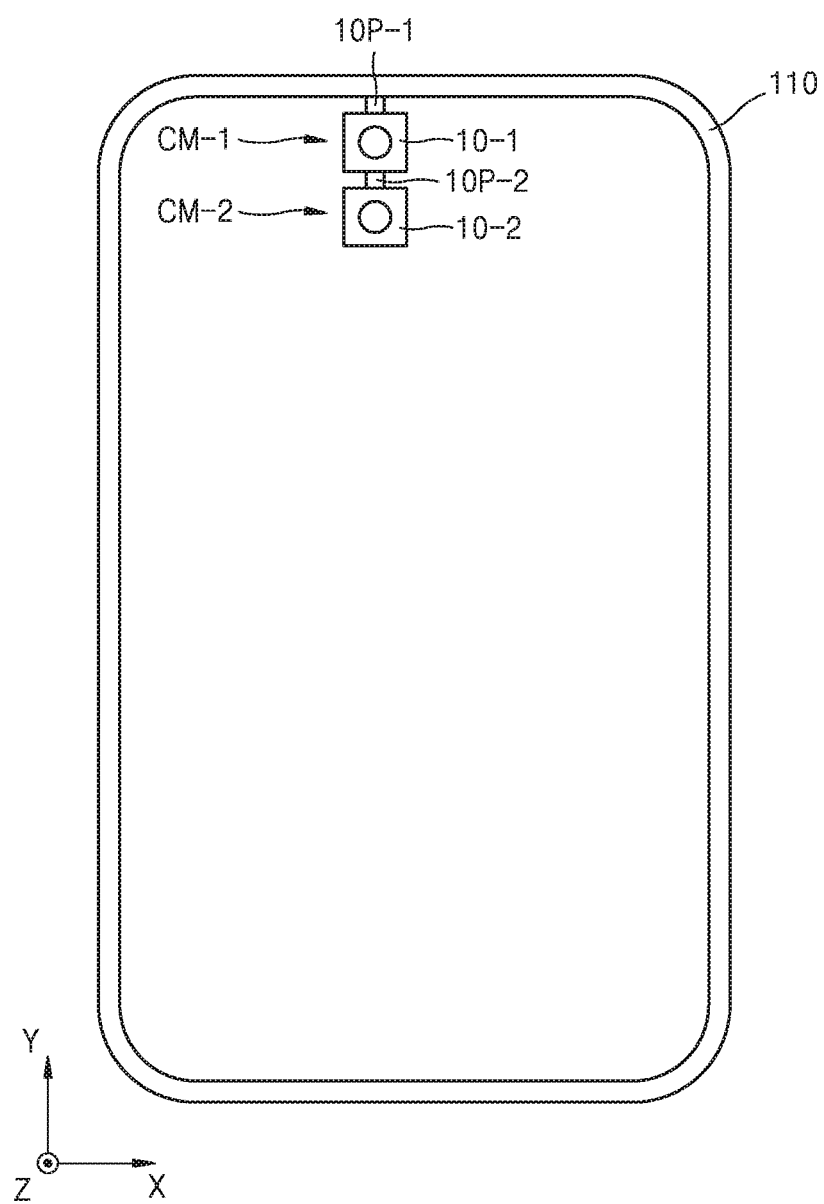
Figure 17C:
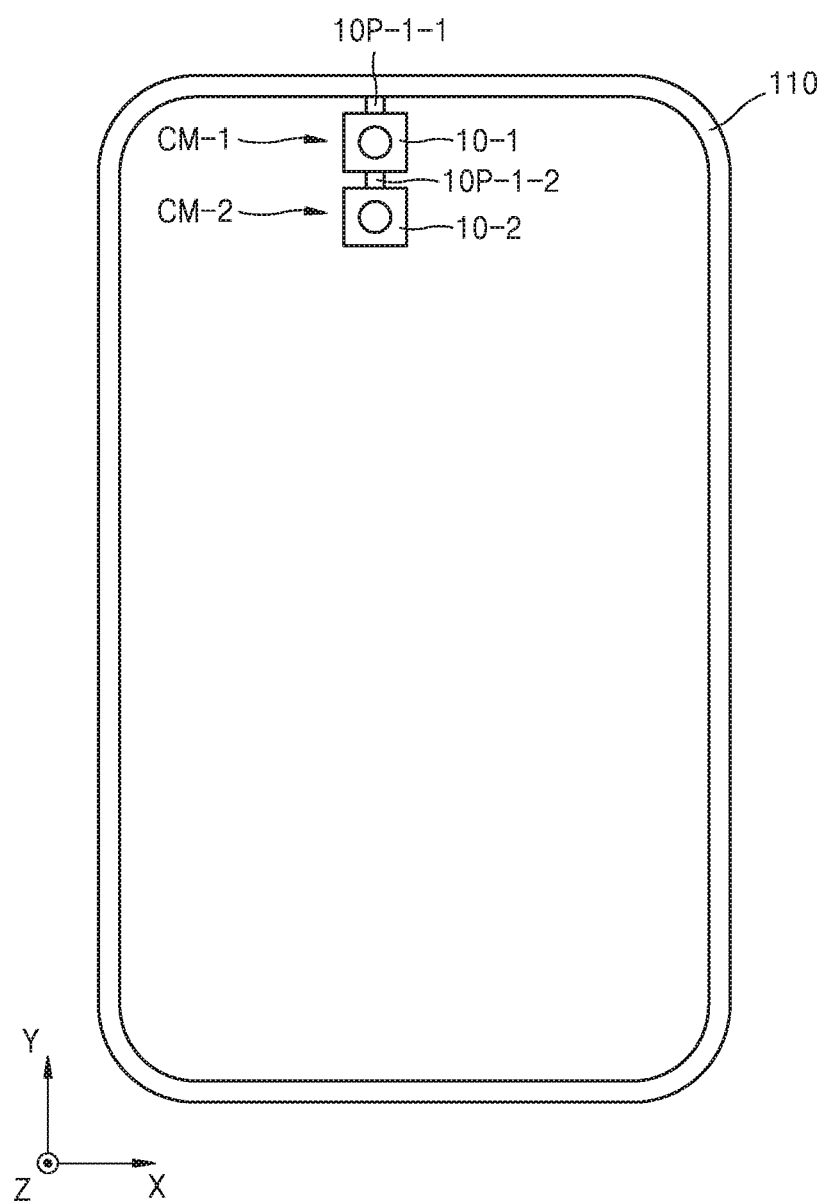

FIGS. 17A to 17C are plan views illustrating a device housing and camera modules in electronic devices according to embodiments. In the embodiments of FIGS. 17A-17C, a device housing 110 may include a first camera module CM-1 and a second camera module CM-2.

Referring to FIG. 17A, in some embodiments, a protruding portion 10P-1 of a shielding structure 10-1 of the first camera module CM-1 and a protruding portion 10P-2 of a shielding structure 10-2 of the second camera module CM-2 may contact the side wall of the device housing 110. In some embodiments, both the first camera module CM-1 and the second camera module CM-2 may be front cameras, and in other embodiments both the first camera module CM-1 and the second camera module CM-2 may be rear cameras. A combination of the first camera module CM-1 and the second camera module CM-2 may be, for example, a combination of a wide-angle camera and a telephoto camera, a combination of a color camera and an infrared (IR) camera, or a combination of a main camera and a time-of-flight (TOF) camera.

In some embodiments, the protruding portion 10P-1 of the shielding structure 10-1 of the first camera module CM-1 and the protruding portion 10P-2 of the shielding structure 10-2 of the second camera module CM-2 may protrude in the two-dimensionally same direction. For example, a direction in which the protruding portion 10P-1 of the shielding structure 10-1 of the first camera module CM-1 protrudes and a direction in which the protruding portion 10P-2 of the shielding structure 10-2 of the second camera module CM-2 protrudes may be the +Y direction. That is, a surface of the first camera module CM-1, on which the protruding portion 10P-1 of the shielding structure 10-1 of the first camera module CM-1 is positioned, and a surface of the second camera module CM-2, on which the protruding portion 10P-2 of the shielding structure 10-2 of the second camera module CM-2 is positioned, may face the same direction. For example, the surface of the first camera module CM-1, on which the protruding portion 10P-1 of the shielding structure 10-1 of the first camera module CM-1 is positioned, and the surface of the second camera module CM-2, on which the protruding portion 10P-2 of the shielding structure 10-2 of the second camera module CM-2 is positioned, may face the +Y direction.

In other embodiments, unlike in FIG. 17A, the protruding portion 10P-1 of the shielding structure 10-1 of the first camera module CM-1 and the protruding portion 10P-2 of the shielding structure 10-2 of the second camera module CM-2 may protrude in two-dimensionally different directions. For example, the direction in which the protruding portion 10P-1 of the shielding structure 10-1 of the first camera module CM-1 protrudes may be the +Y direction, and the direction in which the protruding portion 10P-2 of the shielding structure 10-2 of the second camera module CM-2 protrudes may be the −X direction. That is, the surface of the first camera module CM-1, on which the protruding portion 10P-1 of the shielding structure 10-1 of the first camera module CM-1 is positioned, and the surface of the second camera module CM-2, on which the protruding portion 10P-2 of the shielding structure 10-2 of the second camera module CM-2 is positioned, may face different directions. For example, the surface of the first camera module CM-1, on which the protruding portion 10P-1 of the shielding structure 10-1 of the first camera module CM-1 is positioned, may face the +Y direction, and the surface of the second camera module CM-2, on which the protruding portion 10P-2 of the shielding structure 10-2 of the second camera module CM-2 is positioned, may face the −X direction.

Referring to FIG. 17B, in some embodiments, the protruding portion 10P-1 of the shielding structure 10-1 of the first camera module CM-1 may contact the side wall of the device housing 110, whereas the protruding portion 10P-2 of the shielding structure 10-2 of the second camera module CM-2 may contact the shielding structure 10-1 of the first camera module CM-1. Therefore, the shielding structure 10-2 of the second camera module CM-2 may be electrically connected to the device housing 110 through the shielding structure 10-1 of the first camera module CM-1. According to such embodiments, since the second camera module CM-2 may be arranged in a position remote from the side wall of the device housing 110, the flexibility of an arrangement design of the second camera module CM-2 may increase.

Referring to FIG. 17C, in some embodiments, the shielding structure 10-1 of the first camera module CM-1 includes a first protruding portion 10P-1-1 and a second protruding portion 10P-1-2, whereas the shielding structure 10-2 of the second camera module CM-2 may include no protruding portions. The first protruding portion 10P-1-21 of the shielding structure 10-1 of the first camera module CM-1 may contact the device housing 110, and the second protruding portion 10P-1-2 of the shielding structure 10-1 of the first camera module CM-1 may contact the shielding structure 10-2 of the second camera module CM-2. Therefore, the shielding structure 10-2 of the second camera module CM-2 may be electrically connected to the device housing 110 through the shielding structure 10-1 of the first camera module CM-1. According to such embodiments, when only the first camera module CM-1 including the shielding structure 10-1 including the first and second protruding portions 10P-1-21 and 10P-1-2 is purchased, the second camera module CM-2 including the shielding structure 10-2 that includes no protruding portion may also be used, which is economical. Furthermore, since the second camera module CM-2 may be arranged in a position remote from the side wall of the device housing 110, the flexibility of an arrangement design of the second camera module CM-2 may increase.

FIGS. 18A to 18H are plan views illustrating a device housing and camera modules in electronic devices according to embodiments. In the embodiments of FIGS. 18A to 18H, a device housing 110b may include a first camera module CM-1, a second camera module CM-2, and a third camera module CM-3 accommodated therein.

Figure 18A:
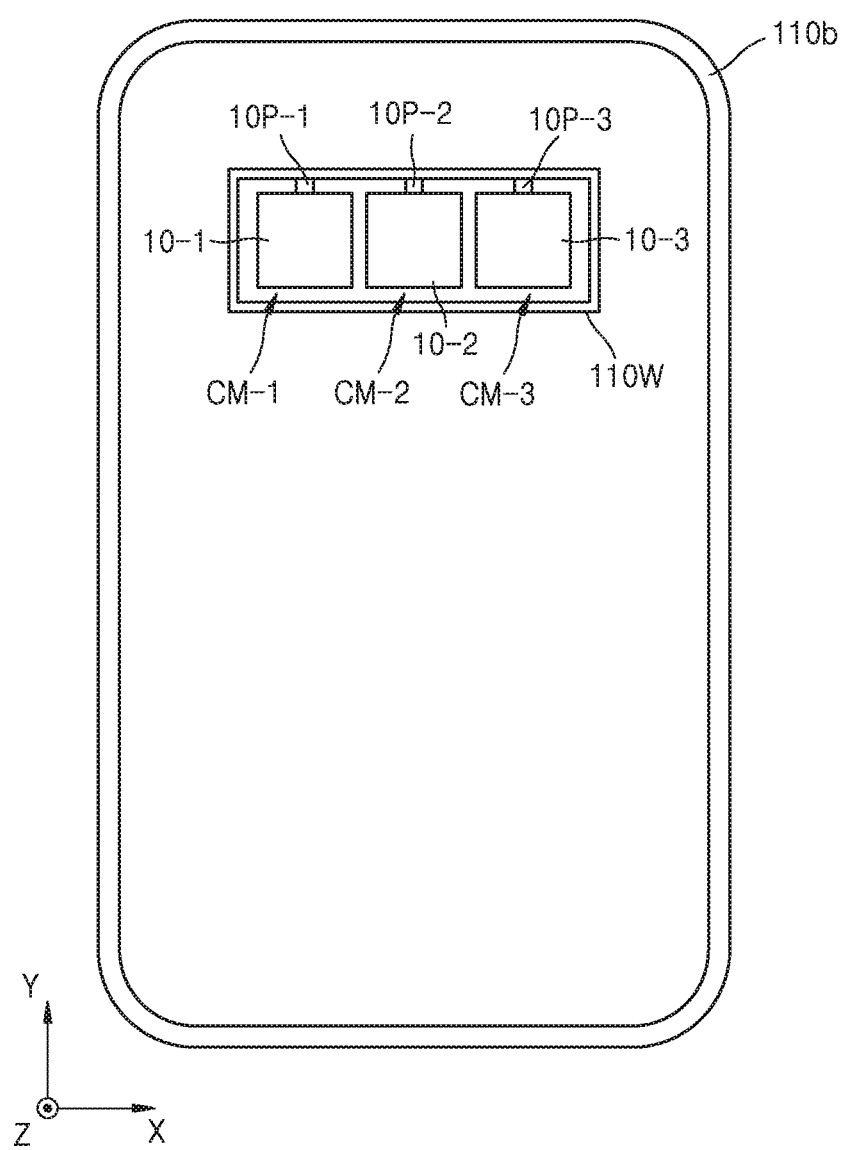
FIGS. 18A to 18H are plan views illustrating a device housing and camera modules in electronic devices according to embodiments.

Referring to FIG. 18A, in some embodiments, an internal wall 110W of the device housing 110b may be positioned around the first camera module CM-1, the second camera module CM-2, and the third camera module CM-3. In some embodiments, the internal wall 110W of the device housing 110b may two-dimensionally and completely surround the first camera module CM-1, the second camera module CM-2, and the third camera module CM-3. The protruding portion 10P-1 of the shielding structure 10-1 of the first camera module CM-1, the protruding portion 10P-2 of the shielding structure 10-2 of the second camera module CM-2, and the protruding portion 10P-3 of the shielding structure 10-3 of the third camera module CM-3 may contact the internal wall 110W of the device housing 110b. It is noted that the protruding portions 10P-1, 10P-2, and 10P-3 all extend in the +Y direction in the example of FIG. 18A to contact the same side wall of the internal wall 110W, but embodiments are not limited thereto. In some embodiments, one or more of the first camera module CM-1, the second camera module CM-2, and the third camera module CM-3 may have a protruding portion that contacts a different side wall of the internal wall 110W (see example of protruding portions contacting different side walls in FIG. 18B). In some embodiments, all of the first camera module CM-1, the second camera module CM-2, and the third camera module CM-3 may be front cameras. In other embodiments, all of the first camera module CM-1, the second camera module CM-2, and the third camera module CM-3 may be rear cameras. A combination of the first camera module CM-1, the second camera module CM-2, and the third camera module CM-3 may be, for example, a combination of a telephoto camera, a wide-angle camera, and an ultra-wide camera or a combination of the telephoto camera, the wide-angle camera, and a time-of-flight (TOF) camera.

In some embodiments, the first camera module CM-1, the second camera module CM-2, and the third camera module CM-3 may be arranged in a row, as illustrated in FIG. 18A. In some embodiments, the device housing 110b may have a long axis (a Y axis) and a short axis (an X axis) and the first camera module CM-1, the second camera module CM-2, and the third camera module CM-3 may be arranged in a direction of the short axis (the X axis) of the device housing 110b.

Figure 18B:
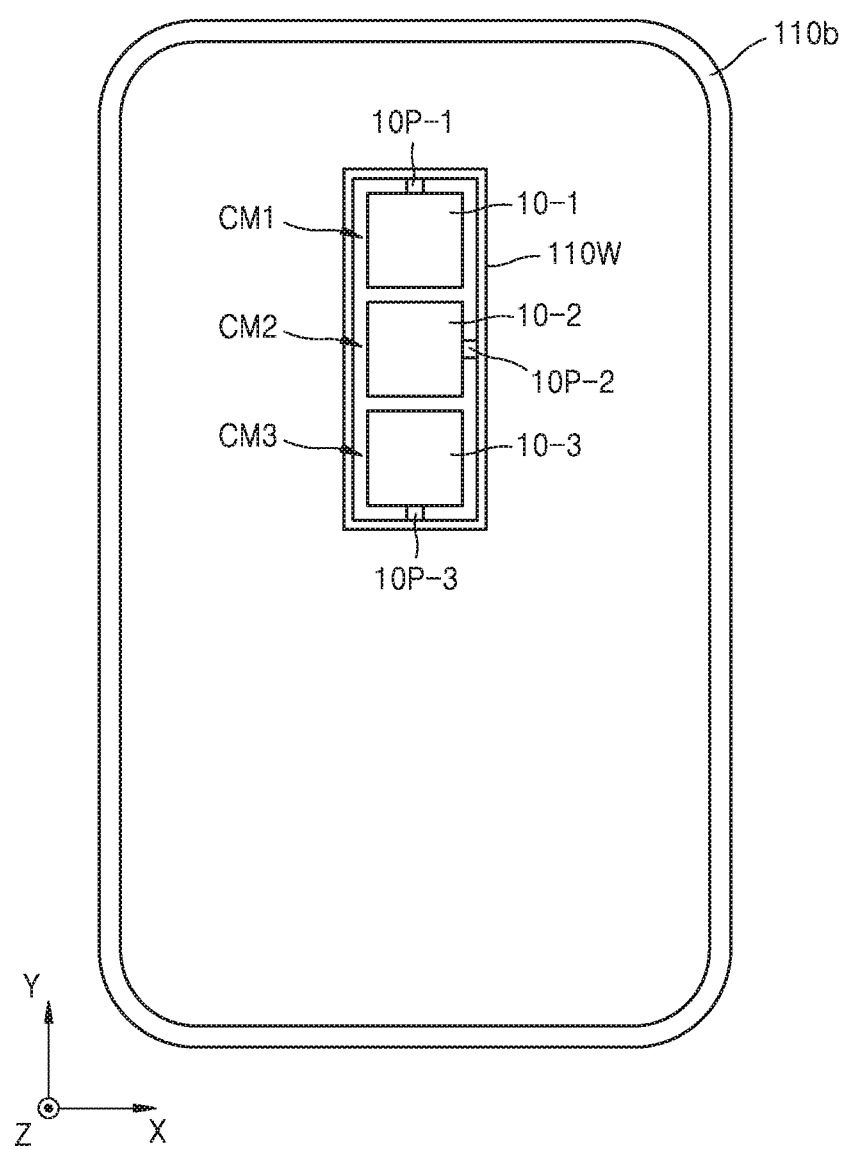

Referring to FIG. 18B, unlike in FIG. 18A, in some embodiments, the first camera module CM-1, the second camera module CM-2, and the third camera module CM-3 may be arranged in the direction of the long axis (the Y axis) of the device housing 110b.

Figure 18C:
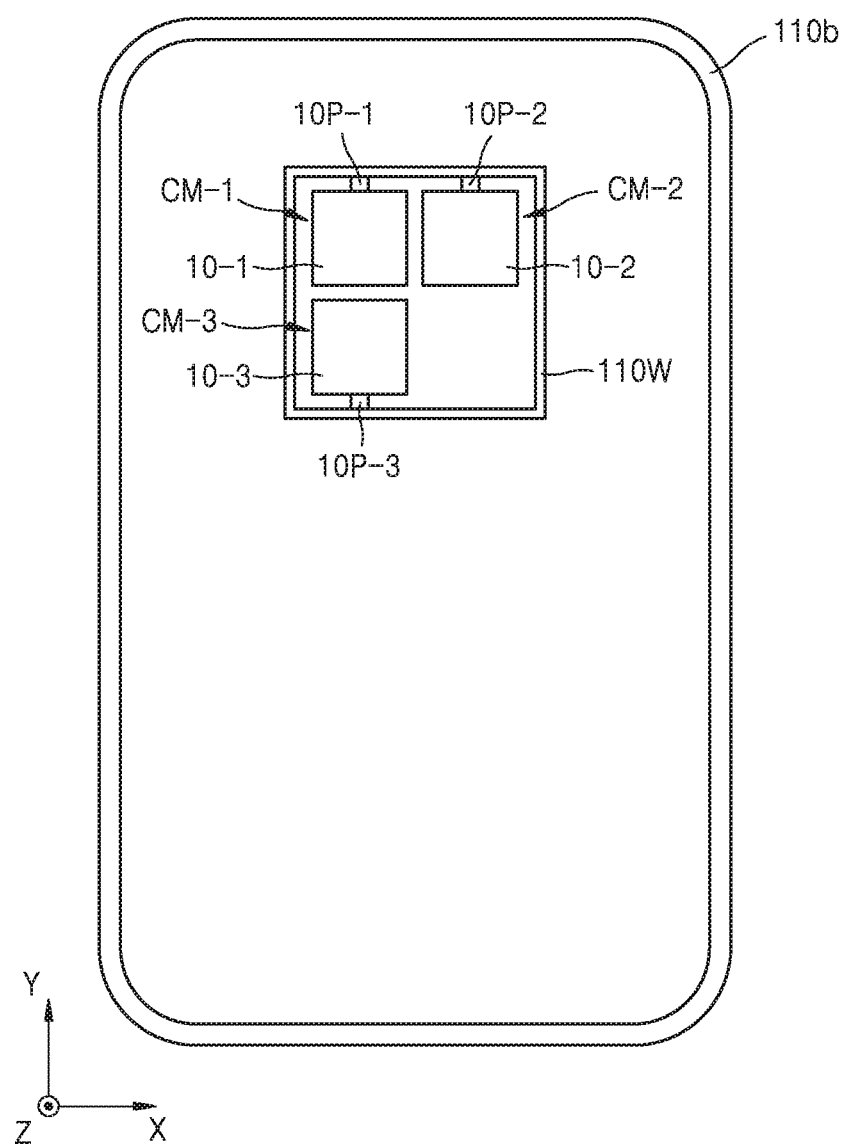

Referring to FIG. 18C, in some embodiments, the first camera module CM-1, the second camera module CM-2, and the third camera module CM-3 may not be arranged in a row. For example, the first camera module CM-1 and the second camera module CM-2 may be arranged in the short axis direction (the X axis direction) and the first camera module CM-1 and the third camera module CM-3 may be arranged in the long axis direction (the Y axis direction).

Figure 18D:
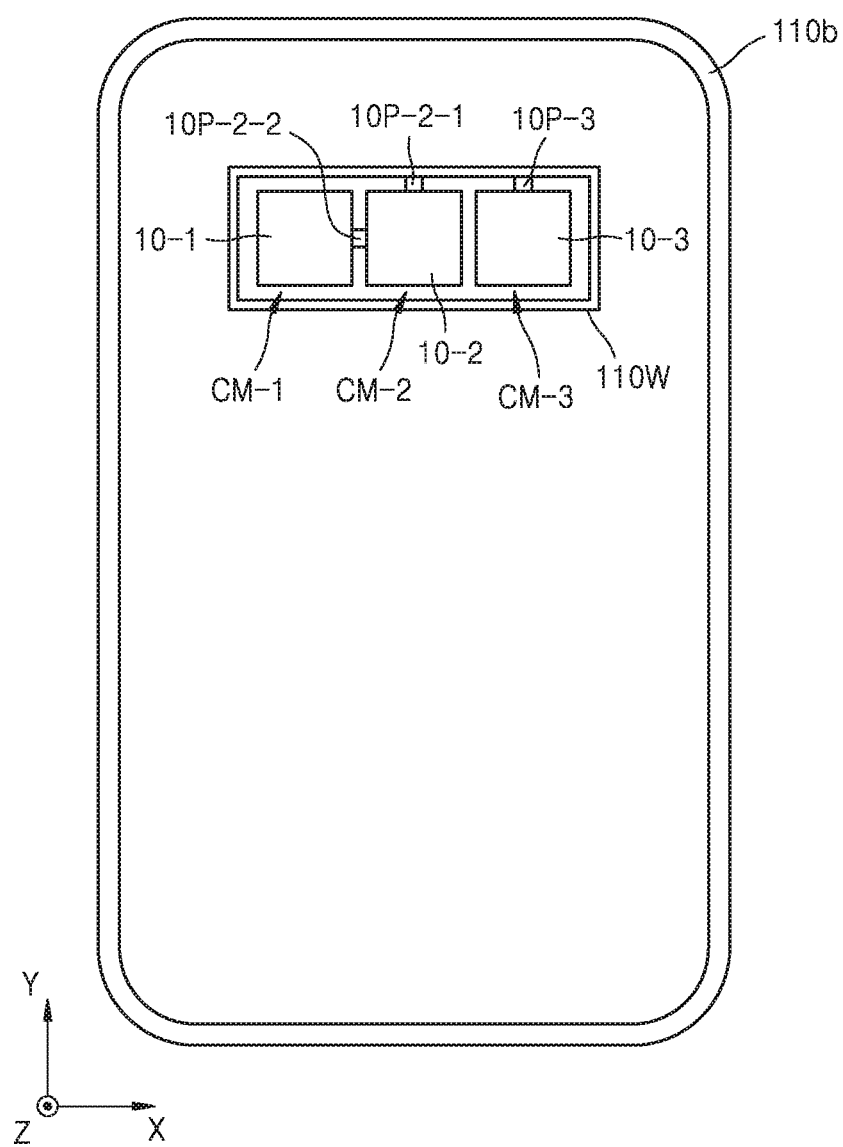

Referring to FIG. 18D, in some embodiments, the shielding structure 10-2 of the second camera module CM-2 may include a first protruding portion 10P-2-1 and a second protruding portion 10P-2-2 and the shielding structure 10-3 of the third camera module CM-3 may include one protruding portion 10P-3, whereas the shielding structure 10-1 of the first camera module CM-1 may include no protruding portion. The first protruding portion 10P-2-1 of the shielding structure 10-2 of the second camera module CM-2 may contact the internal wall 110W of the device housing 110b, and the second protruding portion 10P-2-2 of the shielding structure 10-2 of the second camera module CM-2 may contact the shielding structure 10-1 of the first camera module CM-1. Therefore, the shielding structure 10-1 of the first camera module CM-1 may be electrically connected to the internal wall 110W of the device housing 110b through the shielding structure 10-2 of the second camera module CM-2.

Figure 18E:
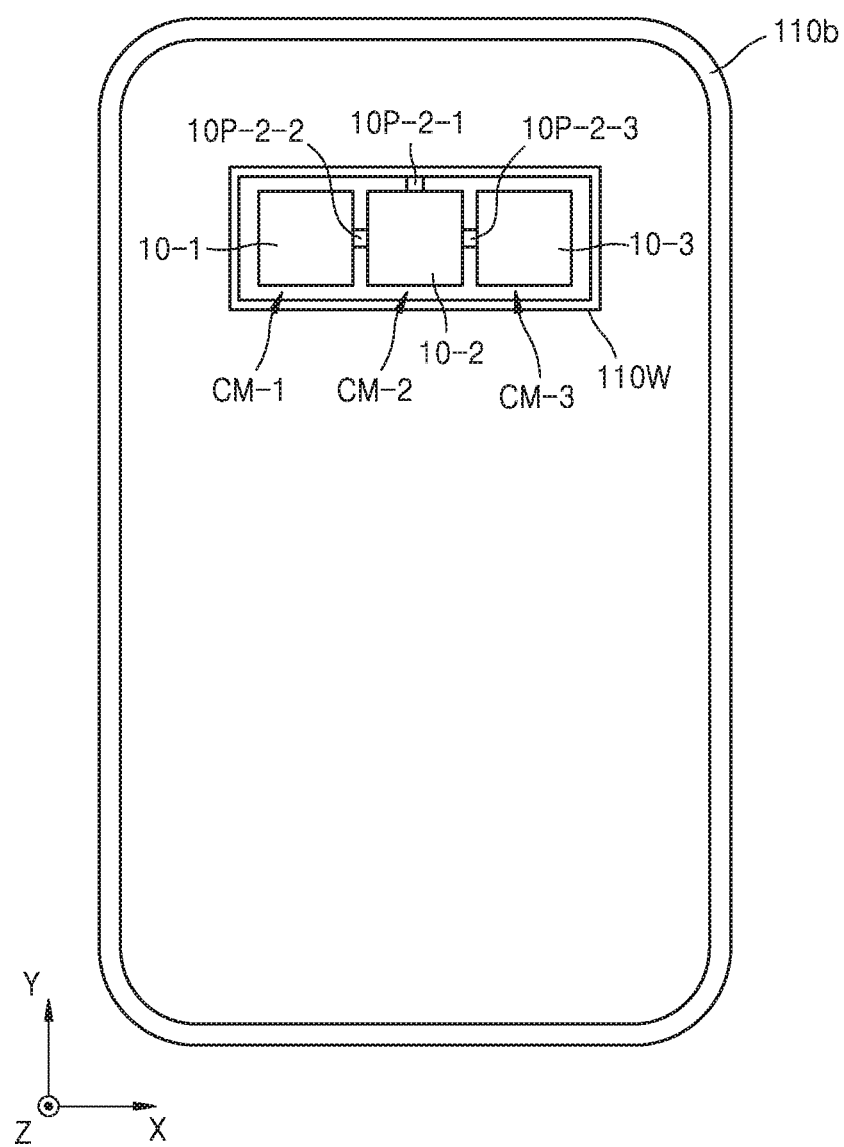

Referring to FIG. 18E, in some embodiments, the shielding structure 10-2 of the second camera module CM-2 may include a first protruding portion 10P-2-1, a second protruding portion 10P-2-2, and a third protruding portion 10P-2-3, whereas the shielding structure 10-1 of the first camera module CM-1 and the shielding structure 10-3 of the third camera module CM-3 each may include no protruding portions. The first protruding portion 10P-2-1 of the shielding structure 10-2 of the second camera module CM-2 may contact the internal wall 110W of the device housing 110b. The second protruding portion 10P-2-2 of the shielding structure 10-2 of the second camera module CM-2 may contact the shielding structure 10-1 of the first camera module CM-1. The third protruding portion 10P-2-3 of the shielding structure 10-2 of the second camera module CM-2 may contact the shielding structure 10-3 of the third camera module CM-3. Therefore, the shielding structure 10-1 of the first camera module CM-1 and the shielding structure 10-3 of the third camera module CM-3 may be electrically connected to the internal wall 110W of the device housing 110b through the shielding structure 10-2 of the second camera module CM-2.

Figure 18F:
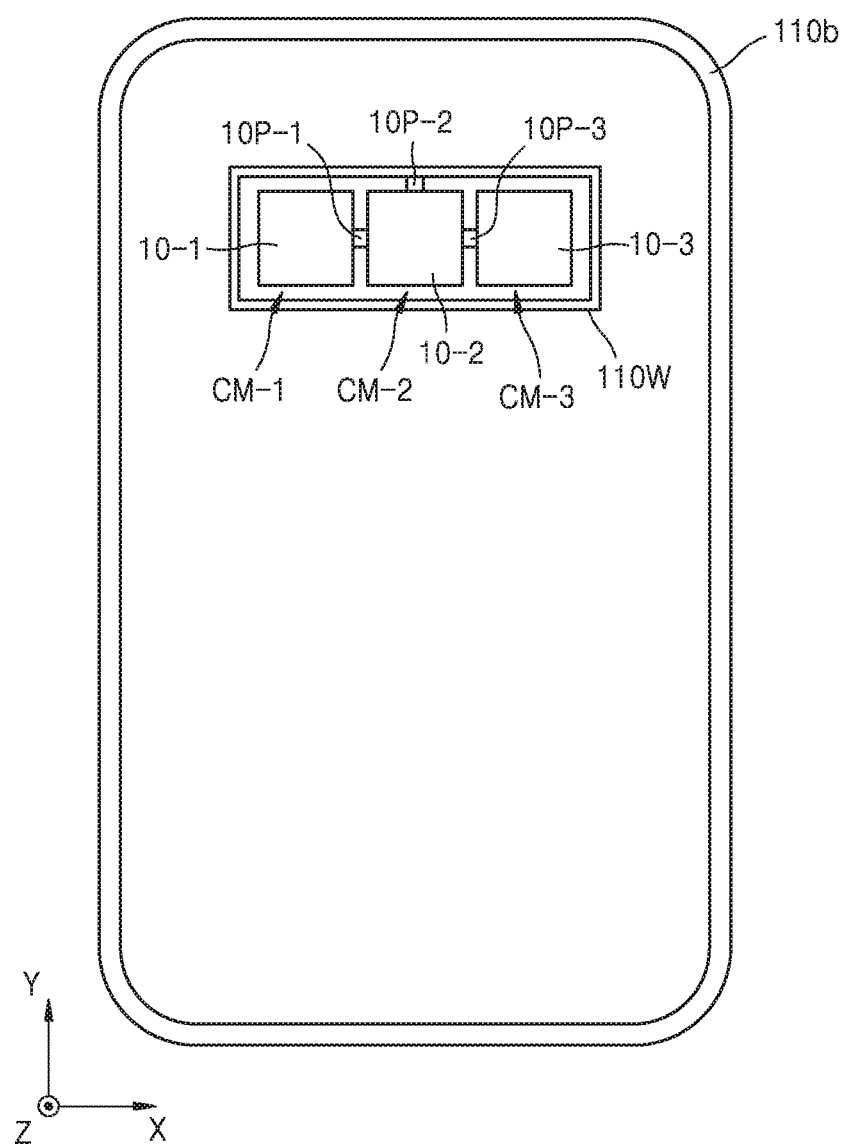

Referring to FIG. 18F, in some embodiments, the protruding portion 10P-2 of the shielding structure 10-2 of the second camera module CM-2 may contact the internal wall 110W of the device housing 110b, whereas the protruding portion 10P-1 of the shielding structure 10-1 of the first camera module CM-1 and the protruding portion 10P-3 of the shielding structure 10-3 of the third camera module CM-3 may contact the shielding structure 10-2 of the second camera module CM-2. Therefore, the shielding structure 10-1 of the first camera module CM-1 and the shielding structure 10-3 of the third camera module CM-3 may be electrically connected to the internal wall 110W of the device housing 110b through the shielding structure 10-2 of the second camera module CM-2.

Figure 18G:
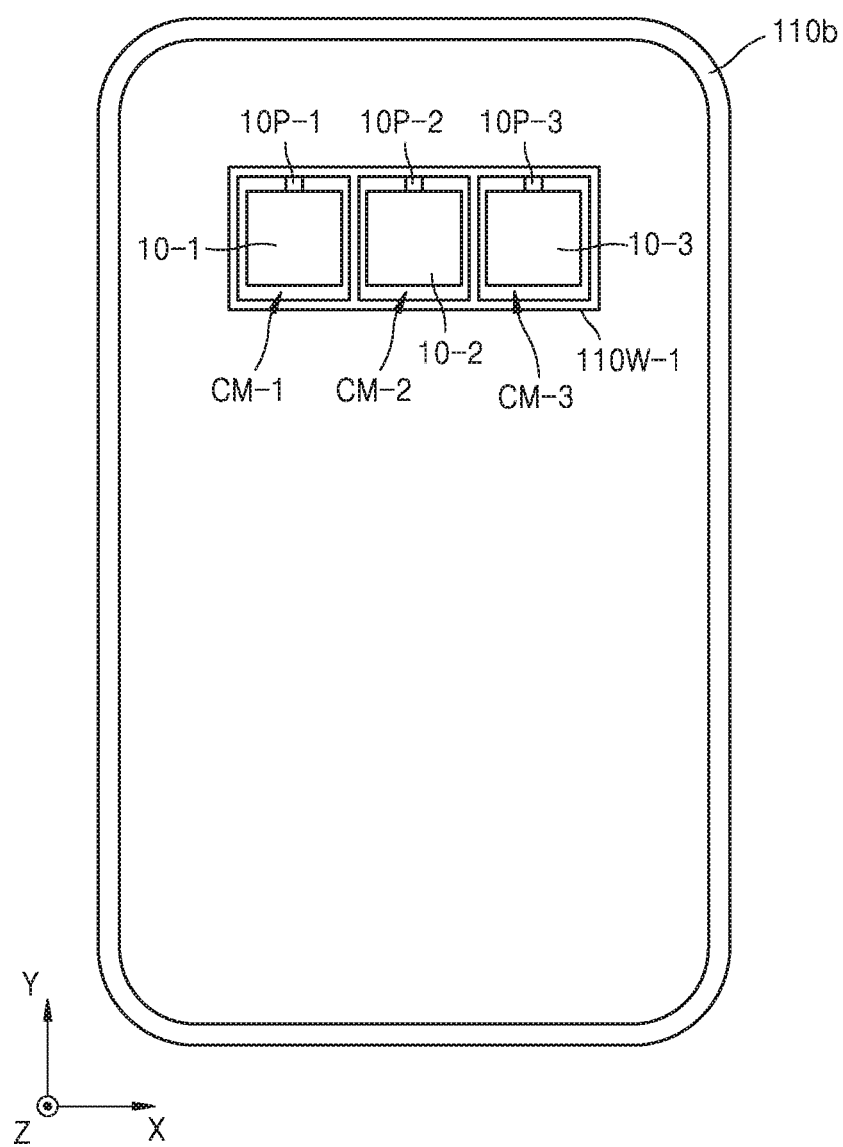

Referring to FIG. 18G, in comparison with the internal wall 110W illustrated in FIG. 18A, in some embodiments, an internal wall 110W-1 of the device housing 110b may further include a first portion between the first camera module CM-1 and the second camera module CM-2 and a second portion between the second camera module CM-2 and the third camera module CM-3. In other words, the internal wall 110W-1 of the device housing 110b may surround each of the first camera module CM-1, the second camera module CM-2, and the third camera module CM-3. According to such embodiments, the internal wall 110W-1 of the device housing 110b may be used for aligning the first to third camera modules CM-1, CM-2, and CM-3.

Figure 18H:
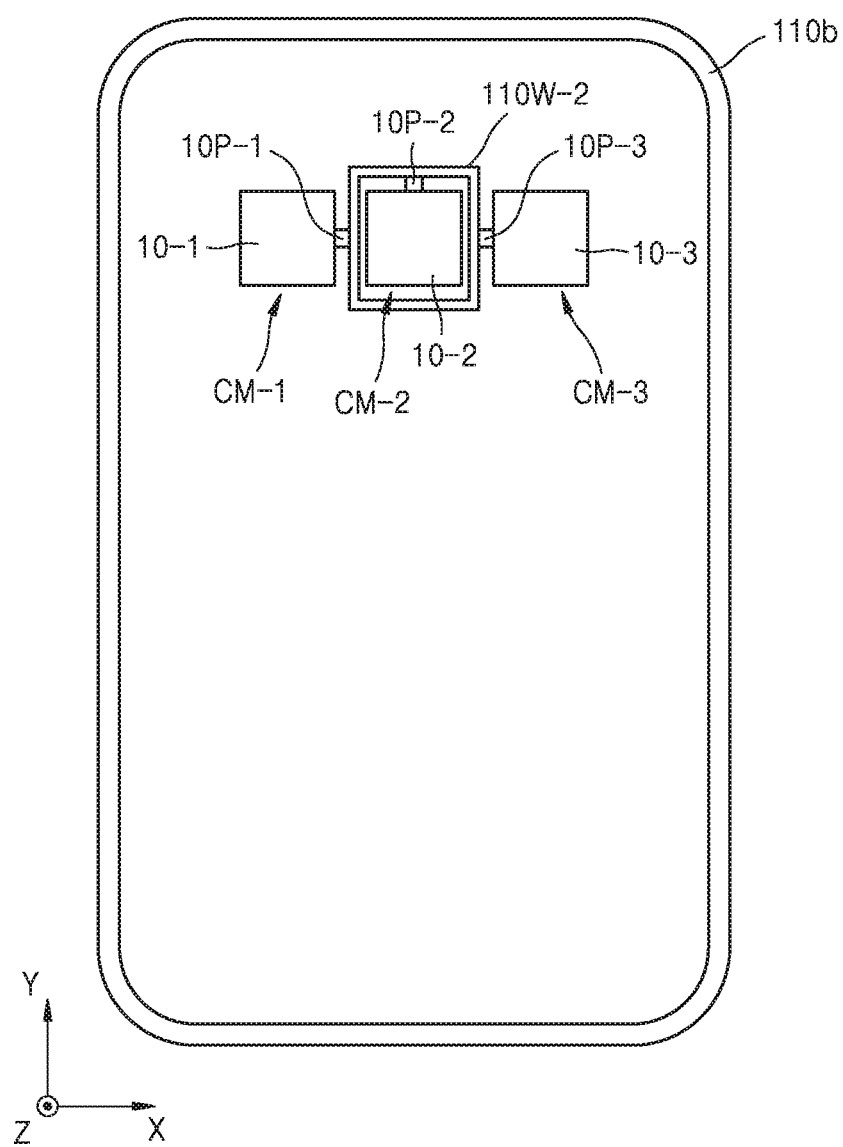

Referring to FIG. 18H, in some embodiments, an internal wall 110W-2 of the device housing 110b may be positioned only around the second camera module CM-2. In some embodiments, the second camera module CM-2 may be positioned in a space surrounded by the internal wall 110W-2 of the device housing 110b, whereas the first camera module CM-1 and the third camera module CM-3 may be positioned outside the space surrounded by the internal wall 110W-2 of the device housing 110b. Therefore, the protruding portion 10P-2 of the shielding structure 10-2 of the second camera module CM-2 may contact an internal surface of the internal wall 110W-2 of the device housing 110b, whereas the protruding portion 10P-1 of the shielding structure 10-1 of the first camera module CM-1 and the protruding portion 10P-3 of the shielding structure 10-3 of the third camera module CM-3 may contact an external surface of the internal wall 110W-2.

FIGS. 19A to 19E are plan views illustrating a flange and camera modules in electronic devices according to embodiments. In the embodiments of FIGS. 19A to 19E, a flange 170 may include a first camera module CM-1, a second camera module CM-2, and a third camera module CM-3 accommodated therein.

Figure 19A:
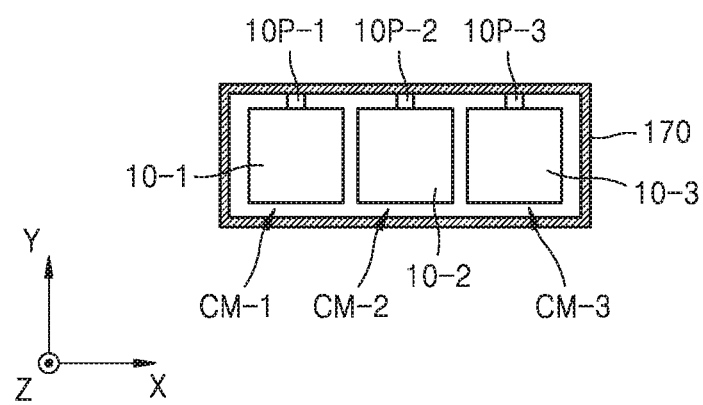
FIGS. 19A to 19E are plan views illustrating a flange and camera modules in electronic devices according to embodiments.

Referring to FIG. 19A, in some embodiments, the flange 170 may surround the first camera module CM-1, the second camera module CM-2, and the third camera module CM-3. The protruding portion 10P-1 of the shielding structure 10-1 of the first camera module CM-1, the protruding portion 10P-2 of the shielding structure 10-2 of the second camera module CM-2, and the protruding portion 10P-3 of the shielding structure 10-3 of the third camera module CM-3 may contact the flange 170. It is noted that the protruding portions 10P-1, 10P-2, and 10P-3 all extend in the +Y direction in the example of FIG. 19A to contact the same side wall of the flange 170, but embodiments are not limited thereto. In some embodiments, one or more of the first camera module CM-1, the second camera module CM-2, and the third camera module CM-3 may have a protruding portion that contacts a different side wall of the flange 170. Although the first camera module CM-1, the second camera module CM-2, and the third camera module CM-3 are illustrated in FIG. 19A as being arranged in a row in the X direction, similar to the description with reference to FIGS. 18A to 18C, the arrangement of the first camera module CM-1, the second camera module CM-2, and the third camera module CM-3 may be arranged in alternate arrangements such as those illustrated in FIGS. 18A-18C except with a flange 170.

Figure 19B:
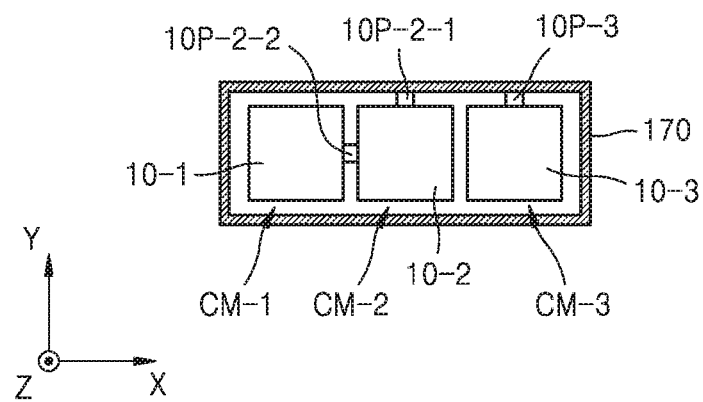

Referring to FIG. 19B, in some embodiments, the shielding structure 10-2 of the second camera module CM-2 includes the first and second protruding portions 10P-2-1 and 10P-2-2 and the shielding structure 10-3 of the third camera module CM-3 includes the protruding portion 10P-3, whereas the shielding structure 10-1 of the first camera module CM-1 may include no protruding portion. The first protruding portion 10P-2-1 of the shielding structure 10-2 of the second camera module CM-2 may contact the flange 170 and the second protruding portion 10P-2-2 of the shielding structure 10-2 of the second camera module CM-2 may contact the shielding structure 10-1 of the first camera module CM-1. Therefore, the shielding structure 10-1 of the first camera module CM-1 may be electrically connected to the flange 170 through the shielding structure 10-2 of the second camera module CM-2.

Figure 19C:
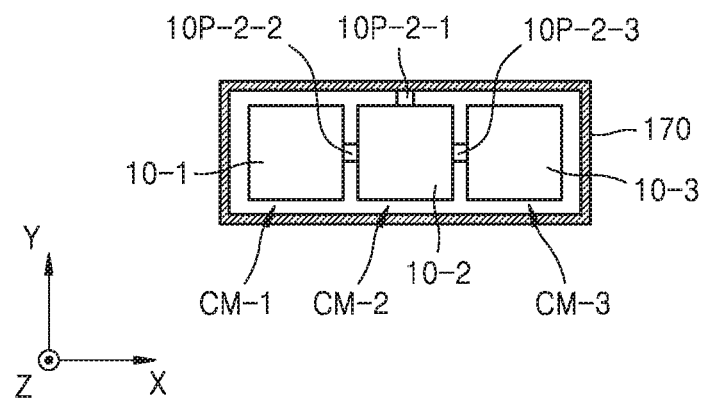

Referring to FIG. 19C, the shielding structure 10-2 of the second camera module CM-2 includes the first to third protruding portions 10P-2-1, 10P-2-2, and 10P-2-3, the shielding structure 10-1 of the first camera module CM-1 and the shielding structure 10-3 of the third camera module CM-3 each may include no protruding portions. The first protruding portion 10P-2-1 of the shielding structure 10-2 of the second camera module CM-2 may contact the flange 170. The second protruding portion 10P-2-2 of the shielding structure 10-2 of the second camera module CM-2 may contact the shielding structure 10-1 of the first camera module CM-1. The third protruding portion 10P-2-3 of the shielding structure 10-2 of the second camera module CM-2 may contact the shielding structure 10-3 of the third camera module CM-3. Therefore, the shielding structure 10-1 of the first camera module CM-1 and the shielding structure 10-3 of the third camera module CM-3 may be electrically connected to the flange 170 through the shielding structure 10-2 of the second camera module CM-2.

Figure 19D:
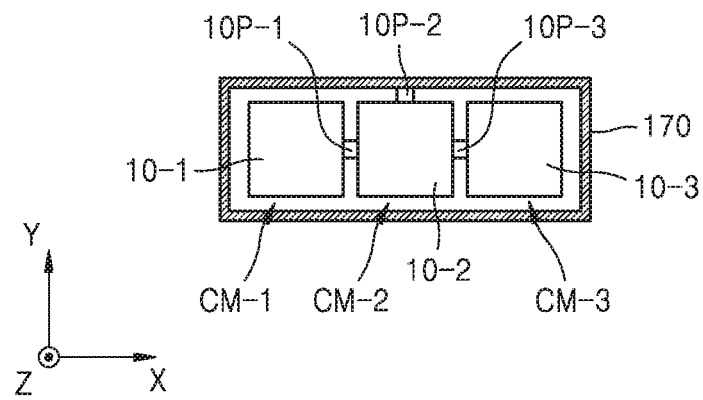

Referring to FIG. 19D, the protruding portion 10P-2 of the shielding structure 10-2 of the second camera module CM-2 may contact the flange 170, whereas the protruding portion 10P-1 of the shielding structure 10-1 of the first camera module CM-1 and the protruding portion 10P-3 of the shielding structure 10-3 of the third camera module CM-3 may contact the shielding structure 10-2 of the second camera module CM-2. Therefore, the shielding structure 10-1 of the first camera module CM-1 and the shielding structure 10-3 of the third camera module CM-3 may be electrically connected to the flange 170 through the shielding structure 10-2 of the second camera module CM-2.

Figure 19E:
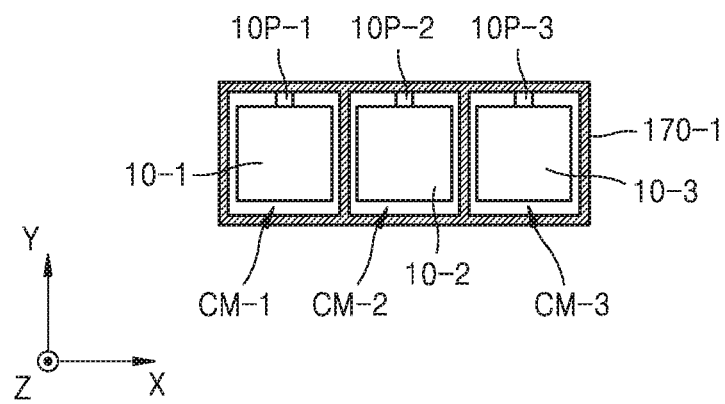

Referring to FIG. 19E, in comparison with the flange 170 illustrated in FIG. 19A, in some embodiments, the flange 170-1 may further include a first portion between the first camera module CM-1 and the second camera module CM-2 and a second portion between the second camera module CM-2 and the third camera module CM-3. That is, the flange 170 may surround each of the first camera module CM-1, the second camera module CM-2, and the third camera module CM-3. According to such embodiments, the flange 170-1 may be used for aligning the first to third camera modules CM-1, CM-2, and CM-3.

While the present disclosure has been particularly shown and described with reference to various embodiments thereof, it will be understood that various changes in form and details may be made therein without departing from the spirit and scope of the following claims.

What is claimed is:

1. An electronic device comprising:
a camera module that includes an image sensor and a shielding structure configured to shield components of the camera module from electromagnetic interference (EMI); and
an external structure that two-dimensionally surrounds the camera module, at least a portion of the external structure being conductive,
wherein the shielding structure comprises an accommodating portion configured to accommodate the image sensor, and a protruding portion that protrudes from the accommodating portion, and
wherein the protruding portion of the shielding structure directly contacts the external structure.

2. The electronic device of claim 1, wherein the protruding portion protrudes outward from a side wall of the accommodating portion.

3. The electronic device of claim 1, wherein the protruding portion is configured to maintain contact with the external structure by elasticity.

4. The electronic device of claim 1, wherein the external structure forms at least a portion of an external form of the electronic device.

5. The electronic device of claim 4, wherein the external structure forms at least a portion of a side surface of the electronic device.

6. The electronic device of claim 1, wherein the external structure is not exposed to the outside of the electronic device.

7. The electronic device of claim 1, wherein the external structure comprises a conductive body and an insulating coating provided on the conductive body.

8. The electronic device of claim 1, wherein the shielding structure further comprises an adhesive configured to attach the protruding portion to the accommodating portion.

9. The electronic device of claim 1, wherein the protruding portion of the shielding structure physically contacts the external structure.

10. An electronic device comprising:
a main circuit board;
an electronic component connected to the main circuit board;
a first camera module connected to the main circuit board;
a device housing including a side wall that surrounds a space in which the main circuit board, the electronic component, and the first camera module are positioned; and
a front panel configured to cover the space in which the main circuit board, the electronic component, and the first camera module are positioned,
wherein at least a portion of the device housing is conductive,
wherein the first camera module comprises a first image sensor, and a first shielding structure that surrounds the first image sensor,
wherein the first shielding structure of the first camera module comprises a first protruding portion that protrudes from the first shielding structure and physically contacts the device housing.

11. The electronic device of claim 10, wherein the first protruding portion contacts the side wall of the device housing.

12. The electronic device of claim 10, wherein the device housing further comprises a bottom configured to cover the space in which the main circuit board and the first camera module are positioned.

13. The electronic device of claim 12, wherein the device housing further comprises an internal wall that is positioned in the space surrounded by the side wall of the device housing and that extends from the bottom of the device housing, and
wherein the first protruding portion contacts the internal wall.

14. The electronic device of claim 10, wherein the first camera module includes a front camera module that faces the front panel, and
wherein the first protruding portion of the first shielding structure of the front camera module contacts the side wall of the device housing.

15. The electronic device of claim 14, further comprising a second camera module including a second image sensor and a second shielding structure, the second shielding structure surrounding the second image sensor and including a second protruding portion,
wherein the second camera module includes a rear camera module positioned in the space surrounded by the side wall of the device housing and facing a direction away from the front panel, and
wherein the second protruding portion of the second shielding structure of the rear camera module contacts the first shielding structure of the front camera module.

16. The electronic device of claim 14, further comprising a second camera module including a second image sensor and a second shielding structure surrounding the second image sensor,
  wherein the second camera module includes a rear camera module positioned in the space surrounded by the side wall of the device housing and facing a direction away from the front panel,
  wherein the first shielding structure of the front camera module further comprises a second protruding portion that contacts the second shielding structure of the rear camera module.

17. The electronic device of claim 10, wherein the electronic component is directly connected to the main circuit board, and the first camera module is directly connected to the main circuit board.

18. The electronic device of claim 10, wherein the first shielding structure includes a plurality of side walls and a top connected to each of the plurality of side walls,
  the plurality of side walls are formed on the main circuit board to surround the first image sensor, and
  the first protruding portion protrudes from one of the plurality of side walls at a position that is spaced apart from the top and spaced apart from the main circuit board.

19. An electronic device comprising:
  a camera module that includes an image sensor and a shielding structure configured to shield components of the camera module from electromagnetic interference (EMI), the shielding structure comprising a plurality of side walls and a top connected to each of the plurality of side walls, the image sensor being accommodated in a space formed by the plurality of side walls and the top; and
  an external structure that two-dimensionally surrounds the camera module, at least a portion of the external structure being conductive,
  wherein the shielding structure comprises a protruding portion that protrudes from a side wall of the plurality of side walls at a position on the side wall that is spaced away from the top and spaced away from an edge of the side wall opposite from the top,
  wherein the protruding portion of the shielding structure contacts the at least portion of the external structure that is conductive.

* * * * *